(12) United States Patent
Lee et al.

(10) Patent No.: US 9,530,494 B2
(45) Date of Patent: Dec. 27, 2016

(54) MEMORY DEVICE AND METHOD OF OPERATING THE SAME

(71) Applicant: SAMSUNG ELECTRONICS CO., LTD., Suwon-Si, Gyeonggi-Do (KR)

(72) Inventors: Yong-Kyu Lee, Hwaseong-Si (KR); Dae-Seok Byeon, Seongnam-Si (KR); Yeong-Taek Lee, Seoul (KR); Chi-Weon Yoon, Seoul (KR); Hyun-Kook Park, Anyang-Si (KR); Hyo-Jin Kwon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 57 days.

(21) Appl. No.: 14/697,244

(22) Filed: Apr. 27, 2015

(65) Prior Publication Data
US 2016/0027510 A1   Jan. 28, 2016

(30) Foreign Application Priority Data
Jul. 28, 2014  (KR) .................. 10-2014-0096015

(51) Int. Cl.
*G11C 16/10* (2006.01)
*G11C 13/00* (2006.01)

(52) U.S. Cl.
CPC ....... *G11C 13/0069* (2013.01); *G11C 13/0033* (2013.01); *G11C 13/0035* (2013.01); *G11C 16/10* (2013.01); *G11C 2013/0092* (2013.01)

(58) Field of Classification Search
CPC ....... G11C 16/10; G11C 11/5628; G11C 16/12
USPC .................. 365/185.19, 163, 185.28, 57
See application file for complete search history.

(56) References Cited

U.S. PATENT DOCUMENTS

| | | | |
|---|---|---|---|
| 7,646,632 B2 | 1/2010 | Philipp et al. | |
| 8,094,488 B2 | 1/2012 | Lee | |
| 8,320,158 B2 | 11/2012 | Kanno et al. | |
| 8,498,146 B2 | 7/2013 | Sekar et al. | |
| 8,654,564 B2 | 2/2014 | Kwak et al. | |
| 8,665,633 B2 | 3/2014 | Azuma et al. | |
| 2012/0044733 A1* | 2/2012 | Scheuerlein | B82Y 10/00 365/51 |
| 2013/0201750 A1 | 8/2013 | Lee et al. | |
| 2013/0223133 A1 | 8/2013 | Azuma et al. | |
| 2013/0235648 A1 | 9/2013 | Kim et al. | |
| 2014/0022832 A1 | 1/2014 | Lee | |

* cited by examiner

*Primary Examiner* — Jason Lappas
(74) *Attorney, Agent, or Firm* — Volentine & Whitt, PLLC

(57) ABSTRACT

A method of operating a memory device, which includes of memory cells respectively arranged in regions where first signal lines and second lines cross each other, includes determining a plurality of pulses so that each of the plurality of pulses that are sequentially applied to a selected memory cell among the plurality of memory cells is changed according to a number of times of executing programming loops. In response to the change of the plurality of pulses, at least one of a first inhibit voltage and a second inhibit voltage is determined so that a voltage level of at least one of the first and second inhibit voltages that are respectively applied to unselected first and second signal lines connected to unselected memory cells among the plurality of memory cells is changed according to the number of times of executing the programming loops.

13 Claims, 28 Drawing Sheets

MEMORY DEVICE AND METHOD OF OPERATING THE SAME

CROSS-REFERENCE TO RELATED APPLICATIONS

This application claims the benefit of Korean Patent Application No. 10-2014-0096015, filed on Jul. 28, 2014, in the Korean Intellectual Property Office, the disclosure of which is incorporated herein in its entirety by reference.

BACKGROUND

The application relates to a memory device, and more particularly, to a memory device including memory cells that are respectively disposed in regions where first signal lines and second signal lines cross each other, and a method of operating the memory device.

As demands for high capacity and low power consumption memory devices have increased, research on next-generation memory devices such as non-volatile memory devices that do not require a refresh operation has been actively conducted. These next-generation memory devices are required to have a high integrity characteristic like Dynamic Random Access Memory (DRAM), a non-volatile characteristic like flash memory, and high speed like static RAM (SRAM). Phase-change RAM (PRAM), Nano Floating Gate Memory (NFGM), Polymer RAM (PoRAM), Magnetic RAM (MRAM), Ferroelectric RAM (FeRAM), and Resistive RAM (RRAM) have been highlighted as some of the next-generation memory devices.

SUMMARY

According to an aspect of the application, there is provided a method of operating a memory device comprising a plurality of memory cells that are respectively arranged in regions where a plurality of first signal lines and a plurality of second lines cross each other, the method including: determining a plurality of pulses so that each of the plurality of pulses that are sequentially applied to a selected memory cell among the plurality of memory cells may be changed according to a number of times of executing programming loops; and determining, in response to the change of the plurality of pulses, at least one of a first inhibit voltage and a second inhibit voltage, so that a voltage level of at least one of the first and second inhibit voltages, that are respectively applied to unselected first and second signal lines connected to unselected memory cells among the plurality of memory cells, is changed according to the number of times of executing the programming loops.

The plurality of pulses may be sequentially provided from a write circuit that is connected to the selected first signal line connected to the selected memory cell, and at least one of an amplitude and a pulse width of each of the plurality of pulses may be changed according to the number of times of executing the programming loops, and the determining of the at least one of the first and second inhibit voltages may include determining at least one of the first and second inhibit voltages according to a change in a node voltage of a connection node between the selected first signal line and the write circuit according to an increase in the plurality of pulses.

The determining of at least one of the first and second inhibit voltages may include determining the second inhibit voltage so that a voltage level of the second inhibit voltage is reduced according to the number of times of executing the second inhibit voltage if the node voltage is reduced according to the increase in the plurality of pulses. The determining of at least one of the first and second inhibit voltages may include determining the first inhibit voltage so that a voltage level of the first inhibit voltage is reduced according to the number of times of executing the programming loops according to the reduction in the voltage level of the second inhibit voltage.

The determining of at least one of the first and second inhibit voltages may include determining the second inhibit voltage so that the voltage level of the second inhibit voltage is increased according to the number of times of executing the programming loops if the node voltage increases according to the increase in the plurality of pulses. The determining of at least one of the first and second inhibit voltages may include determining the first inhibit voltage so that the voltage level of the first inhibit voltage is increased according to the number of times of executing the programming loops according to the increase in the voltage level of the second inhibit voltage.

The determining of at least one of the first and second inhibit voltages may include determining the second inhibit voltage so that the voltage level of the second inhibit voltage is changed according to the number of times of executing the programming loops, and the method may further include applying the determined second inhibit voltage to the unselected second signal lines.

The determining of at least one of the first and second inhibit voltages may further include: detecting the node voltage; and determining, based on the detected node voltage, the second inhibit voltage so that the voltage level of the second inhibit voltage is changed according to the number of times of executing the programming loops, wherein the method may further include applying the determined second inhibit voltage to the unselected second signal lines.

The determining of at least one of the first and second inhibit voltages may include determining the second inhibit voltage to have a voltage level that is equal to or less than the node voltage.

The plurality of pulses may correspond to a plurality of current pulses, and the determining of the plurality of pulses may include determining the plurality of current pulses so that at least one of amplitudes and pulse widths of the plurality of current pulses is increased according to the number of times of executing the programming loops. The method may further include performing a set writing operation in which the plurality of current pulses are sequentially applied to the selected memory cell so that a resistance level of the selected memory cell is reduced.

The plurality of pulses may correspond to a plurality of voltage pulses, and the determining of the plurality of pulses may include determining the plurality of voltage pulses so that at least one of amplitudes and pulse widths of the plurality of voltage pulses is increased according to the number of times of executing the programming pulses. The method may further include performing a reset writing operation in which the determined voltages are sequentially applied to the selected memory cell so that a resistance level of the selected memory is increased.

According to an aspect of the application, there is provided a method of operating a memory device including a plurality of memory cells that are respectively arranged in regions where a plurality of first signal lines and a plurality of second signal lines cross each other, the method including: sequentially applying a plurality of set pulses to a selected memory cell among the plurality of memory cells so that a resistance of the selected memory cell is reduced;

and applying a first inhibit voltage and a second inhibit voltage respectively to unselected first and second signal lines that are connected to unselected memory cells among the plurality of memory cells, wherein a voltage level of at least one of the first and second inhibit voltages may be changed according to a number of times of executing programming loops.

The plurality of set pulses may correspond to a plurality of current pulses, and at least one of amplitudes and pulse widths of the plurality of current pulses may be increased according to the number of times of executing the programming loops.

The plurality of set pulses may be sequentially provided from a write circuit connected to a selected first signal line that is connected to the selected memory cell, and at least one of an amplitude and a pulse width of each of the plurality of set pulses may be increased according to the number of times of executing the programming loops.

When a node voltage of a connection node between the selected first signal line and the write circuit is reduced according to an increase in the plurality of set pulses, a voltage level of the second inhibit voltage may be reduced according to the number of times of executing the programming loops, and when the node voltage is increased according to the increase in the plurality of set pulses, the voltage level of the second inhibit voltage may be increased according to the number of times of executing the programming loops.

According to an aspect of the application, there is provided a method of operating a memory device including a plurality of memory cells that are arranged respectively in regions where a plurality of first signal lines and a plurality of second signal lines cross each other, the method including: sequentially applying a plurality of set currents that are increased according to a number of times of executing programming loops to a selected memory cell among the plurality of memory cells via a selected first signal line that is connected to the selected memory cell, so that a resistance of the selected memory cell is reduced; and applying an inhibit voltage, a voltage level of which is reduced according to the number of times of executing the programming loops, to unselected second signal lines that are connected to unselected memory cells among the plurality of memory cells.

The plurality of set currents may be sequentially provided from a write circuit connected to the selected first signal line, and the voltage level of the inhibit voltage may be reduced based on a node voltage of a connection node between the selected first signal line and the write circuit.

The voltage level of the inhibit voltage may be equal to or less than the node voltage.

According to an aspect of the application, there is provided a memory device including: a memory cell array comprising a plurality of memory cells that are respectively arranged in regions where a plurality of first signal lines and a plurality of second signal lines cross each other; and a control logic configured to determine at least one of a first inhibit voltage and a second inhibit voltage so that a voltage level of at least one of the first and second inhibit voltages that are respectively applied to unselected first and second signal lines that are connected to unselected memory cells among the plurality of memory cells is changed according to the number of times of executing the programming loops.

The control logic may determine a plurality of pulses that are sequentially applied to a selected memory cell among the plurality of memory cells, so that at least one of amplitudes and pulse widths of the plurality of pulses is increased according to the number of times of executing the programming loops.

The control logic may generate inhibit control signals for adjusting voltage levels of the first and second inhibit voltages, and the memory device may further include an inhibit voltage generator that generates the first and second inhibit voltages according to the inhibit control signals and provides the first and second inhibit voltages to the unselected first and second signal lines.

The memory device may further include a write circuit connected to a selected first signal line that is connected to the selected memory cell, and configured to sequentially provide the plurality of pulses to the selected memory cell.

The memory device may further include a voltage detector configured to detect a node voltage of a connection node between the selected first signal line and the write circuit, and provide the detected node voltage to the control logic.

According to an aspect of the application, there is provided a method executed by a memory controller of operating a nonvolatile memory having an array of memory cells that are addressed by a plurality of first and second signal lines. The method includes sequentially applying electrical pulses, through a selected signal line that is one of the first and second signal lines, to a selected memory cell of the nonvolatile memory such that a voltage potential across the selected memory cell increases throughout the sequence and sequentially applying, to unselected ones of the first signal lines, first inhibit signals whose amplitudes either increase throughout the sequence or decrease throughout the sequence. Each of the unselected first signal lines is a pathway through which leakage current may potentially flow due to the electrical pulses flowing through the selected signal line and a memory cell addressed by the unselected first signal line and the selected signal line.

The method may further include sequentially applying, to unselected ones of the second signal lines, second inhibit signals whose amplitudes either increase throughout the sequence or decrease throughout the sequence. Each of the unselected second signal lines is a pathway through which leakage current may potentially flow due to the electrical pulses flowing through the selected signal line and a memory cell addressed by the unselected second signal line and the selected signal line.

According to an aspect of the method, for each of the electrical pulses applied in the sequence, one of the first inhibit signals in the sequence is concurrently applied and, thereby, reduces leakage currents flowing through the unselected first signal lines during the application of each of the electrical pulses in the sequence.

According to an aspect of the method, for each of the electrical pulses applied in the sequence, one of the first inhibit signals in the sequence is concurrently applied and, thereby, reduces leakage currents flowing through the unselected first signal lines during the application of each of the electrical pulses in the sequence. And for each of the electrical pulses applied in the sequence, one of the second inhibit signals in the sequence is concurrently applied and, thereby, reduces leakage currents flowing through the unselected second signal lines during the application of each of the electrical pulses in the sequence.

According to an aspect of the method, the amplitudes of each of the first inhibit signals within the sequence of first inhibit signals and the amplitudes of each of the second inhibit signals within the sequence of second inhibit signals are selected so that the voltage potential existing across every memory cell addressed by a pair of the first and second signal lines is equal to or less than a threshold voltage for activating the flow of current through the memory cell during each electrical pulse applied in the sequence.

According to an aspect of the method, the threshold voltage is that of a switching device for selecting the memory cell.

According to an aspect of the method, the sequence of electrical pulses are applied during a programming loop of the selected memory cell.

BRIEF DESCRIPTION OF THE DRAWINGS

Exemplary embodiments of the application will be more clearly understood from the following detailed description taken in conjunction with the accompanying drawings in which.

DETAILED DESCRIPTION OF THE EMBODIMENTS

Figure 1:
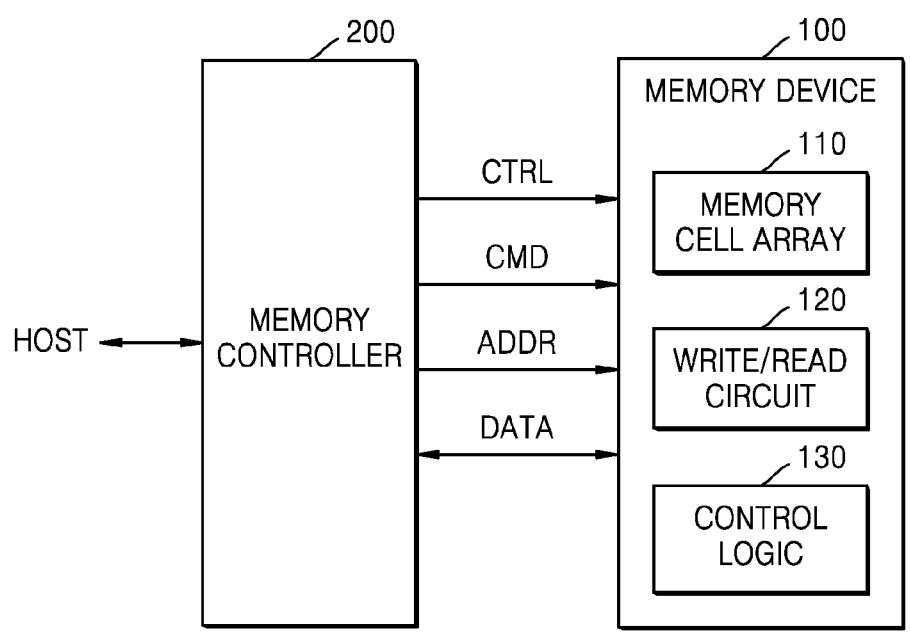
FIG. 1 is a block diagram of a memory system according to an embodiment of the application.

The present technology will now be described more fully with reference to the accompanying drawings, in which exemplary embodiments of the technology are shown. The technology may, however, be embodied in many different forms, and should not be construed as being limited to the embodiments set forth herein. Thus, the application may include all revisions, equivalents, or substitutions which are included in the concept and the technical scope related to the present application. Like reference numerals in the drawings denote like elements. In the drawings, the dimension of structures may be exaggerated for clarity.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify the existence of a recited form, a number, a process, an operation, a component, and/or groups thereof, not excluding the existence of one or more other recited forms, one or more other numbers, one or more other processes, one or more other operations, one or more other components and/or groups thereof.

While terms "first" and "second" are used to describe various components, it is obvious that the components are not limited to the terms "first" and "second". The terms "first" and "second" are used only to distinguish between each component. For example, a first component may indicate a second component or a second component may indicate a first component without conflicting with the application.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram of a memory system 10 according to an embodiment of the present application.

Referring to FIG. 1, the memory system 10 may include a memory device 100 and a memory controller 200. The memory device 100 may include a memory cell array 110, a write/read circuit 120, and a control logic 130.

In response to a write/read request from a host, the memory controller 200 may read data stored in the memory device 100 or may control the memory device 100 to write data to the memory device 100. In more detail, the memory controller 200 may provide an address ADDR, a command CMD, and a control signal CTRL to the memory device 100 and thus may control a program (or write) operation, a read operation, and an erase operation with respect to the memory device 100. Also, data DATA to be written and data DATA to be read may be exchanged between the memory controller 200 and the memory device 100.

Although not illustrated, the memory controller 200 may include Random Access Memory (RAM), a processing unit, a host interface, and a memory interface. The RAM may be used as an operation memory of the processing unit. The processing unit may control operations of the memory controller 200. The host interface may include a protocol for exchanging data between the host and the memory controller 200. For example, the memory controller 200 may communicate with an external source (i.e., the host) by using at least one of various interface protocols including USB, MMC, PCI-E, ATA (Advanced Technology Attachment), Serial-ATA, Parallel-ATA, SCSI, ESDI, and Integrated Drive Electronics (IDE).

The memory cell array 110 may include a plurality of memory cells (not shown) that are disposed respectively in regions where a plurality of first signal lines and a plurality of second signal lines cross each other. The memory device 100 including such above memory cell array 110 may be referred to as a cross point memory device.

In the present embodiment, the plurality of first signal lines may be a plurality of bit lines, and the plurality of second signal lines may be a plurality of word lines. In another embodiment, the plurality of first signal lines may be a plurality of word lines, and the plurality of second signal lines may be a plurality of bit lines.

In the present embodiment, the plurality of memory cells may include resistance-type memory cells or resistive memory cells that include a variable resistor device (not shown) having a variable resistor. For example, when the resistance of the variable resistor device that is formed of a phase change material (e.g., Ge—Sb—Te) changes according to temperature, the memory device 100 may be Phase-change RAM (PRAM). As another example, when the variable resistor device is formed of complex metal oxide including an upper electrode, a lower electrode, and transition metal oxide therebetween, the memory device 100 may be Resistive RAM (RRAM). As another example, when the variable resistor device is formed of an upper electrode of a magnetic material, a lower electrode of the magnetic material, and a dielectric therebetween, the memory device 100 may be Magnetic RAM (MRAM).

The write/read circuit 120 may perform programming loops on a selected memory cell from among a plurality of write memory cells. Here, the number of entire programming loops may be determined in advance, and N is a natural number of 2 or greater. In the present embodiment, the write/read circuit 120 may sequentially apply first through N-th pulses, of which at least one of an amplitude and a pulse increases according to the number of programming loops, to the selected memory cell, and thus, a programming operation may be performed on the selected memory cell.

In the present embodiment, the write/read circuit 120 may be selectively connected to a selected first signal line or a selected second signal line that is connected to the selected memory cell. In one embodiment, if the write/read circuit 120 is connected to the selected first signal line, a plurality of pulses may be applied to the selected memory cell via the selected first signal line. In another embodiment, if the write/read circuit 120 is connected to the selected second signal line, the plurality of pulses may be applied to the selected memory cell via the selected second signal line.

When the writing operation is performed on the selected memory cell from among the plurality of memory cells, the control logic 130 may determine the plurality of pulses so that each of the plurality of pulses applied sequentially to the selected memory cell may increase according to the number of the programming loops. In detail, the control logic 130 may determine the plurality of pulses so that at least one of the amplitude and the pulse width of each pulse may increase according to the number of the programming loops.

The write/read circuit 120 may sequentially provide the plurality of pulses, of which at least one of the amplitude or the pulse width increases according to the number of programming loops, according to the determination of the control logic 130. Accordingly, a node voltage VN at a connection node CN between the selected first or second signal line, to which the write/read circuit 120 is connected, and the write/read circuit 120 may change according to the number of the programming loops.

In addition, when performing the programming operation on the selected memory cell, first and second inhibit voltages are respectively applied to non-selected first and second signal lines that are connected to non-selected memory cells. Here, if the node voltage VN of the connection node CN between the selected first or second signal line and the write/read circuit 120 is changed according to the number of the programming loops, a voltage difference between the selected first or second signal line and the non-selected first or second signal line may increase. Accordingly, leakage current occurring in the non-selected memory cells may increase.

According to the present embodiment, the control logic 130 may determine at least one of the first and second inhibit voltages so that a voltage level of at least one of the first and second inhibit voltages that are applied to the non-selected first and second signals connected to the non-selected memory cells may be changed according to the number of programming loops. In detail, the control logic 130 may determine at least one of the first and second inhibit voltages adaptively to the change of the node voltage VN at the connection node CN between the selected first or second line and the write/read circuit 120.

In one embodiment, if the node voltage VN of the connection node CN between the selected first or second signal line and the write/read circuit 120 is reduced according to the number of programming loops, the control logic 130 may determine that the voltage level of at least one of the first and second inhibit voltages may be reduced according to the number of programming loops. In another embodiment, if the node voltage VN of the connection node CN between the selected first or second signal line and the write/read circuit 120 increases according to the number of programming loops, the control logic 130 may determine that the voltage level of at least one of the first and second inhibit voltages may be increased according to the number of the programming loops.

As described above, one of the first and second inhibit voltages is changed according to the number of the programming loops, the voltage difference between the selected first or second signal line and the non-selected first or second signal line may not increase even with the change in the node voltage VN of the connection node CN between the selected first or second signal line and the write/read circuit 120. Accordingly, the leakage current occurring in the non-selected memory cells may be reduced.

The memory controller 200 and the memory device 100 may be integrated as one semiconductor device. For example, the memory controller 200 and the memory device 100 may be integrated as one semiconductor device forming a memory card. For example, the memory controller 200 and the memory device 100 may be integrated into the semiconductor device and thus configure a PC card (a PCMCIA card), a compact flash card (CF card), a smart media card (SM/SMC), a memory stick, a multimedia card (MMC, RS-MMC, or MMCmicroO, an SD card (SD, miniSD, or microSD), or a universal flash storage (UFS). As another example, the memory controller 200 and the memory device 100 may be integrated into the semiconductor device and thus may form a Solid State Disk/Drive (SSD).

Figure 2:
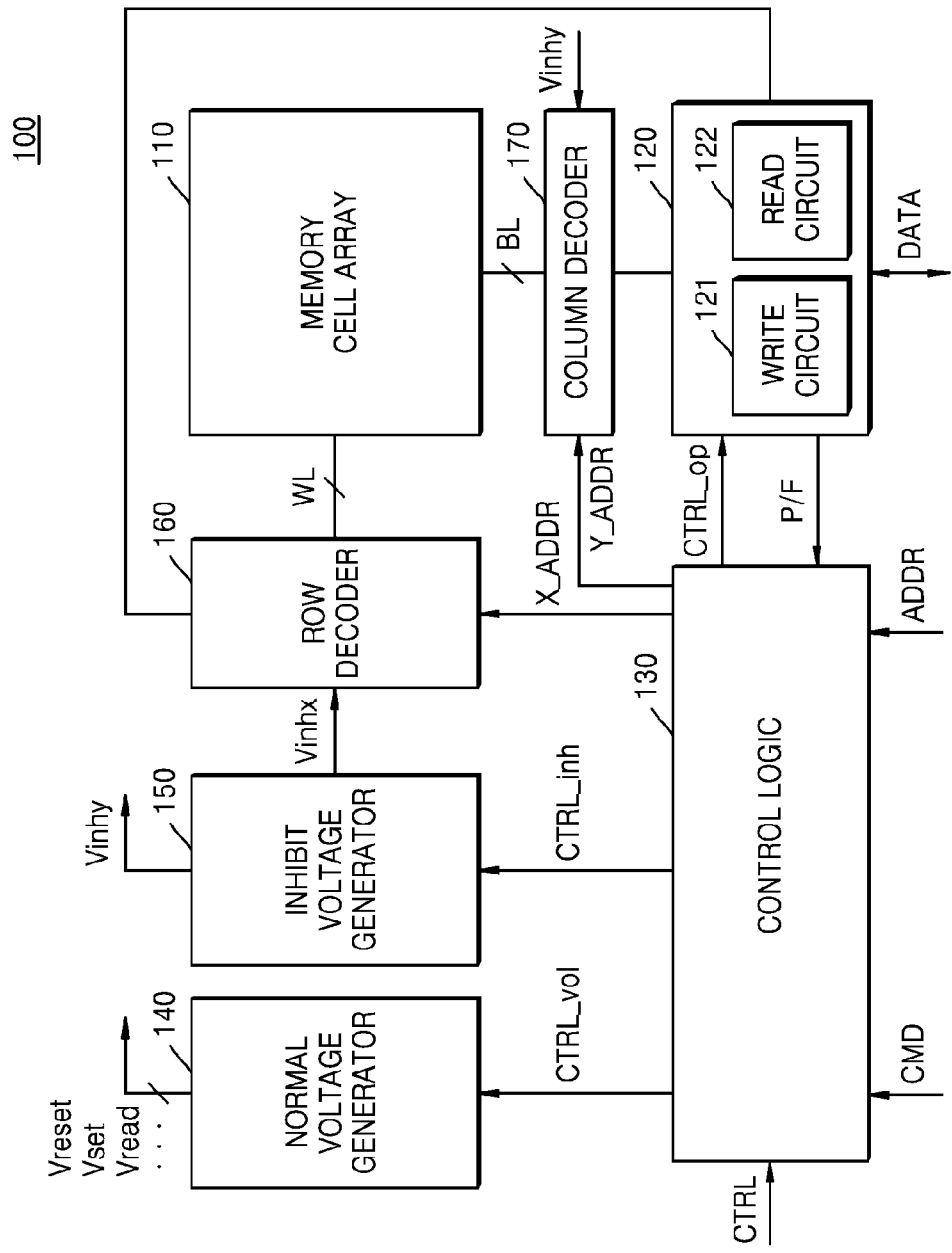
FIG. 2 is a block diagram of an example of a memory device included in the memory system of FIG. 1.

FIG. 2 is a block diagram of the memory device 100 included in the memory system 10 of FIG. 1 in more detail.

Referring to FIG. 2, the memory device 100 may include the memory cell array 110, the write/read circuit 120, the control logic 130, a voltage generator 140, an inhibit voltage generator 150, a row decoder 160, and a column decoder 170. The write/read circuit 120 may include a write circuit 121 and a read circuit 122. Hereinafter, components included in the memory device 100 will be described as below.

The memory cell array 110 may be connected to the plurality of first signal lines and the plurality of second signal lines. Also, the memory cell array 110 may include a plurality of memory cells that are respectively arranged on a region where the plurality of first signal lines and the plurality of second signal lines cross each other. Hereinafter, it is assumed that the plurality of first signal lines are bit lines BL, and the plurality of second signal lines are word lines WL.

Figure 3:
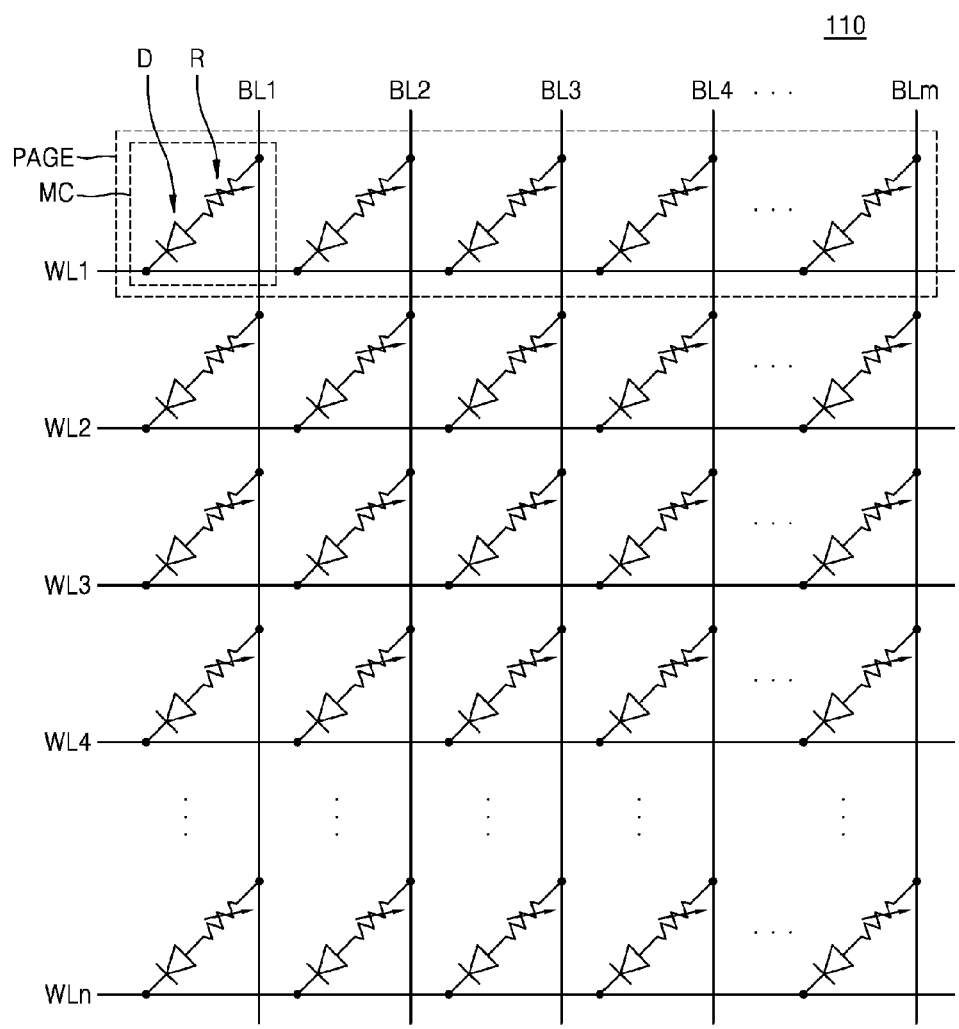
FIG. 3 is a detailed circuit diagram of a memory cell array of FIG. 2.

FIG. 3 is a circuit diagram of the memory cell array 110 of FIG. 2 in more detail.

Referring to FIG. 3, the memory cell array 110 may be a two-dimensional (2D) memory having a horizontal structure, and may include a plurality of word lines WL1 through WLn, a plurality of bit lines BL1 through BLm, and a plurality of memory cells MC. Here, the number of the word lines WL, the number of the bit lines BL, and the number of the memory cells MC may vary depending on the embodiments. However, the application is not limited thereto, that is, the memory cell array 110 may be a three-dimensional array having a vertical structure in another embodiment.

According to the present embodiment, each of the plurality of memory cells MC may include a variable resistor device R and a selection device D. Here, the variable resistor device R may be referred to as a variable resistor material, and the selection device D may be referred to as a switching device.

In an embodiment, the variable resistor device R may be connected between one of the bit lines BL1 through BLm and the selection device D, and the selection device D may be connected between the variable resistor device R and one of the word lines WL1 through WLn. However, one or more embodiments of the application are not limited thereto, and the selection device D may be connected between one of the bit lines BL1 through BLm and the variable resistor device R, and the variable resistor device R may be connected between the selection device D and one of the word lines WL1 through WLn.

The selection device D may be connected between one of the word lines WL1 through WLm and the variable resistor device R, and according to a voltage applied to the connected word line and bit line, a current that is supplied to the variable resistor device R may be controlled. In FIG. 3, the selection device D is shown as a diode; however, one or more embodiments of the application are not limited thereto. That is, the selection device D may be another device that may be switched in another embodiment.

Figure 4:
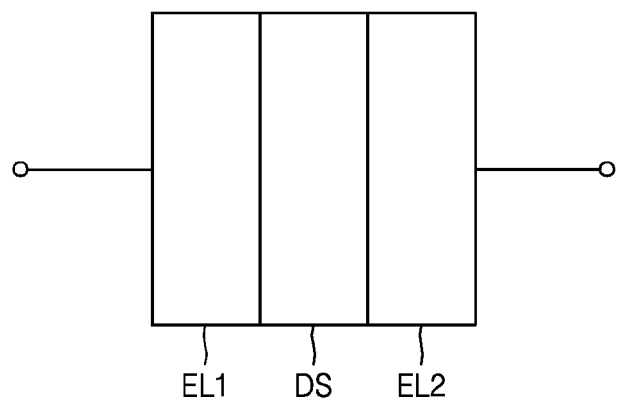
FIG. 4 is a diagram of an example of a variable resistance device included in the memory cell of FIG. 3.

FIG. 4 is a diagram showing an example of the variable resistor device R included in the memory cell MC of FIG. 3.

Referring to FIG. 4, the variable resistor device R may include first and second electrodes EL1 and EL2, and a data storage film DS disposed between the first electrode EL1 and the second electrode EL2.

The first and second electrodes EL1 and EL2 may be formed of various metal, metal oxide, or metal nitride. The first and second electrodes EL1 and EL2 may be formed of aluminum (Al), copper (Cu), titanium nitride (TiN), titanium aluminum nitride (TixAlyNz), iridium (Ir), platinum (Pt), silver (Ag), gold (Au), poly silicon, tungsten (W), titanium (Ti), tantalum (Ta), tantalum nitride (TaN), tungsten nitride (WN), nickel (Ni), cobalt (Co), chrome (Cr), antimony (Sb), iron (Fe), molybdenum (Mo), palladium (Pd), tin (Sn), zirconium (Zr), zinc (Zn), iridium oxide ($IrO_2$), and strontium zirconate oxide ($StZrO_3$).

The data storage film DS may be formed of a bipolar resistive memory material or a unipolar resistive memory material. The bipolar resistive memory material may be programmed as a set state or a reset state according to a polarity of the pulse, and the bipolar resistive memory material may include Perovskite-based materials. In addition, the unipolar resistive memory material may be programmed as a set state or a reset state by the pulse of the same polarity, and the unipolar resistive memory material may include transition metal oxide such as NiOx or TiOx.

FIGS. 5A through 5D are circuit diagrams of modified examples of the memory cell MC of FIG. 4.

Figure 5A:
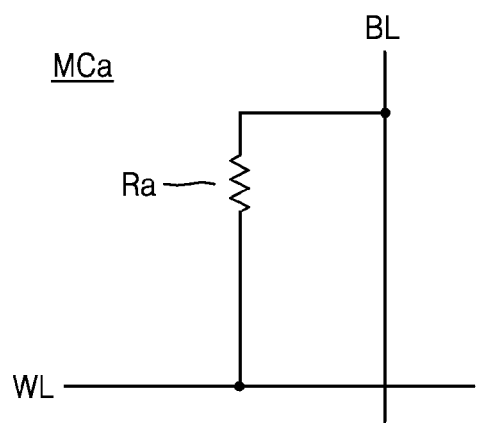
FIGS. 5A through 5D are circuit diagrams of modified examples of the memory cell of FIG. 3.

Referring to FIG. 5A, a memory cell MCa may include a variable resistor device Ra that may be connected between a bit line BL and a word line WL. The memory cell MCa may store data by using voltages that are applied to the bit line BL and the word line WL, respectively.

Figure 5B:
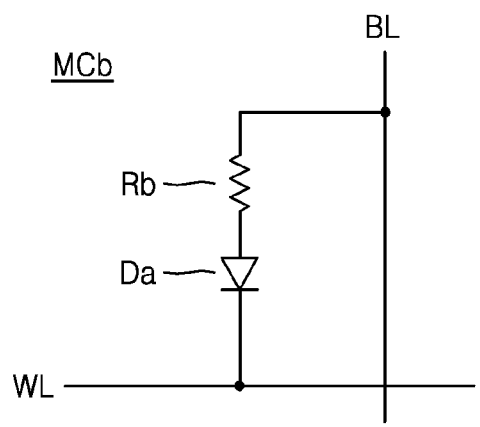

Referring to FIG. 5B, a memory cell MCb may include a variable resistor device Rb and a unidirectional diode Da. The variable resistor device Rb may include a resistive material so as to store data. The unidirectional diode Da may be a selection device, that is, a switching device, for supplying or blocking current to the variable resistor device Rb according to the biases of the word line WL and the bit line BL. The unidirectional diode Da may be connected between the variable resistor device Rb and a word line WL, and the variable resistor device Rb may be connected between a bit line BL and the unidirectional diode Da. Positions of the unidirectional diode Da and the variable resistor device Rb may be switched with each other.

In one embodiment, the unidirectional diode Da may be a PN junction or a PIN junction diode, and an anode of the unidirectional diode Da may be connected to the variable resistor device Rb and a cathode of the unidirectional diode Da may be connected to one of the plurality of word lines WL1 through WLn. Here, when a voltage difference between the anode and the cathode of the unidirectional diode Da becomes greater than a threshold voltage of the unidirectional diode Da, the unidirectional diode Da is turned on to supply the electric current to the variable resistor device Rb.

Figure 5C:
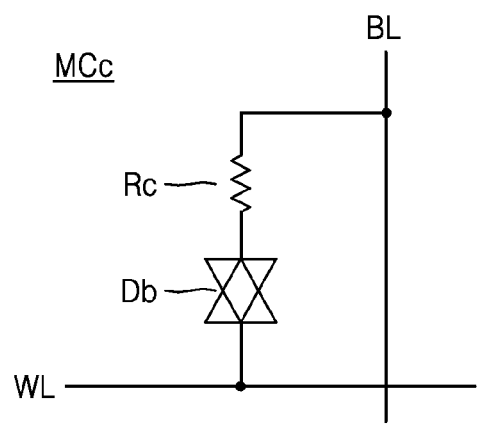

Referring to FIG. 5C, a memory cell MCc may include a variable resistor device Rc and a bidirectional diode Db. The variable resistor device Rc may have a resistance material for storing data. The bidirectional diode Db is connected between the variable resistor device Rc and the word line WL, and the variable resistor device Rc may be connected between the bit line BL and the bidirectional diode Db. Locations of the bidirectional diode Db and the variable resistor device Rc may be exchanged. Leakage current flowing in a non-selected resistive cell may be blocked by the bidirectional diode Db.

Figure 5D:
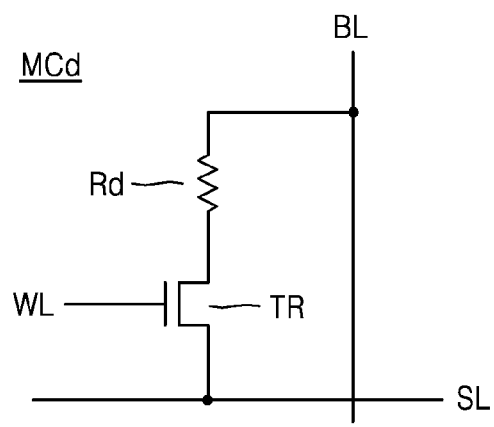

Referring to FIG. 5D, a memory cell MCd may include a variable resistor device Rd and a transistor TR. The transistor TR may be a selection device, that is, a switching device, for supplying or blocking electric current to the variable resistor device Rd according to a voltage of the word line WL. The transistor TR is connected between the variable resistor device Rd and a selection line SL, and the variable resistor device Rd may be connected between the bit line BL and the transistor TR. Locations of the transistor TR and the variable resistor device Rd may be exchanged. The memory cell MCd may be selected or not selected according to turning on/turning off of the transistor TR that is driven by the word line WL.

Referring back to FIG. 2, the write/read circuit 120 may be selectively connected to the row decoder 160 or the column decoder 170, and accordingly, may be selectively connected to the word line WL or the bit line BL. In one embodiment, the write circuit 121 and the read circuit 122 may be connected to the word line WL. In another embodiment, the write circuit 121 and the read circuit 122 may be connected to the bit line BL. In another embodiment, the write circuit 121 may be connected to the word line WL, and the read circuit 122 may be connected to the bit line BL. In another embodiment, the write circuit 121 may be connected to the bit line BL, and the read circuit 122 may be connected to the word line WL.

In the present embodiment, the write/read circuit 120 may be connected to one having a relatively lower voltage between the word line WL and the bit line BL, according to a kind of operation performed with respect to the memory cell array 110. For example, when a writing operation is performed with respect to the memory cell array 110, a relatively high voltage is applied to the bit line BL and a relatively low voltage is applied to the word line WL, and then, the write/read circuit 120 may be connected to the word line WL. However, one or more embodiments of the application are not limited thereto. That is, in another embodiment, the write/read circuit 120 may be connected to one having a relatively higher voltage between the word line WL and the bit line BL.

The write circuit 121 is connected to the selected bit line or the selected word line to provide the selected memory cell MC with pulses, and accordingly, a programming operation (that is, the writing operation) may be performed. Thus, data DATA to be stored may be input to the memory cell array 110. Here, the pulse may be a programming pulse or a writing pulse. In one embodiment, the pulse may be a current pulse, and in another embodiment, the pulse may be a voltage pulse.

In detail, the write circuit 121 may perform a writing operation in a set direction, in which the selected memory cell MC is programmed so that a resistance of the selected memory cell MC is reduced, that is, a set writing operation. Also, the write circuit 121 may perform a writing operation in a reset direction, in which the selected memory cell MC is programmed so that the resistance of the selected memory cell MC is increased, that is, a reset writing operation.

In the present embodiment, the write circuit 121 may sequentially provide the selected memory cell MC with first through N-th current pulses, and the first through N-th current pulses may have increasing current levels since the number of times of executing programming loops increase. In one embodiment, the write circuit 121 provides the selected memory cell MC with the first through N-th current pulses so as to perform the set writing operation on the selected memory cell MC.

Also, in the present embodiment, the write circuit 121 may sequentially provide the selected memory cell MC with first through N-th voltage pulses, and the first through N-th voltage pulses may have increasing voltage levels according to increase in the number of times of executing the programming loops. In one embodiment, the write circuit 121 sequentially provides the selected memory cell MC with the first through N-th voltage pulses so as to perform the reset writing operation on the selected memory cell MC.

In an embodiment, each of the programming loops may include a programming operation (that is, a writing operation) and a verification operation that are sequentially performed. In another embodiment, at least some of the plurality of programming loops may only include the programming operation. For example, from among N programming loops, some programming loops that are performed at initial stage may only include the programming operation without performing the verification operation, thereby increasing the operating speed.

The read circuit 122 may be connected to the selected bit line BL or the selected word line WL to read data DATA stored in the selected memory cell MC, and then, the data DATA stored in the memory cell array 110 may be output.

Specifically, the read circuit 122 may perform a general reading operation on the selected memory cell MC when receiving a read command from the memory controller 200. Also, the read circuit 122 may perform a pre-reading operation, which is a reading operation on the selected memory cell MC before performing the writing operation on the selected memory cell MC in order to read an initial resistance state of the selected memory cell MC in advance.

Moreover, the read circuit 122 may perform a verify reading operation for determining whether the writing operation on the selected memory cell MC is finished, after performing the writing operation on the selected memory cell MC. In more detail, the read circuit 122 reads the resistances of the selected memory cells MC, to which the first through N-th pulses are respectively applied, and may provide the write circuit 121 or the control logic 130 with the read result.

The read circuit 122 may provide the read data DATA to outside of the memory device 100, for example, to the memory controller 200, in a general reading operation. Also, the read circuit 122 may provide the read data DATA to the inside of the memory device 100, for example, the control logic 130 or the write circuit 121, as a pass/fail (P/F) signal representing success/failure of the writing operation, in the pre-reading operation or the verify reading operation.

The control logic 130 may output various control signals for writing data DATA in the memory cell array 110 or reading the data DATA from the memory cell array 110, based on a command CMD, an address ADDR, and a control signal CTRL provided from the memory controller CMD. The various control signals output from the control logic 130 may be provided to the write/read circuit 120, the normal voltage generator 140, the inhibit voltage generator 150, the row decoder 160, and the column decoder 170, and thus, the control logic 130 may control overall operations of the memory device 100.

In more detail, the control logic 130 may generate operation control signals CTRL_op based on the command CMD and the control signal CTRL, and may provide the write/read circuit 120 with the generated operation control signals CTRL_op. For example, the operation control signals CTRL_op may include a write enable signal WEL, a read enable signal REN, a sense enable signal SEN, a discharge signal DIS, a precharge enable signal PRE, and a writing control signal WCS, and the above signals will be described below with reference to FIGS. 15 and 22.

In addition, the control logic 130 may generate a voltage control signal CTRL_vol and an inhibit control signal CTRL_inh based on the command CMD, the control signal CTRL, and the pass/fail signal P/F transmitted from the read circuit 122. The control logic 130 may provide the generated voltage control signal CTRL_vol and the inhibit control signal CTRL_inh respectively to the normal voltage generator 140 and the inhibit voltage generator 150.

Here, the voltage control signal CTRL_vol is a signal for adjusting levels of the voltage provided by the normal voltage generator 140, and the inhibit control signal CTRL_inh is a signal for adjusting levels of the inhibit voltages provided by the inhibit voltage generator 150.

Moreover, the control logic 130 divides the address ADDR into a row address X_ADDR and a column address Y_ADDR to provide the row decoder 160 with the row address X_ADDR and the column decoder 170 with the column address Y_ADDR.

The normal voltage generator 140 may generate various kinds of voltages for performing the writing, reading, and erasing operations with respect to the memory cell array 110 based on the voltage control signal CTRL_vol. In particular, the normal voltage generator 140 may generate a reset write voltage Vreset, a set write voltage Vset, and a read voltage Vread applied to the selected memory cell MC_sel. Also, the normal voltage generator 140 may generate a power source voltage Vdd and a precharge voltage Vpre applied to the write/read circuit 120. In addition, the normal voltage generator 140 may generate a control voltage Vc that is necessary for the write circuit 121 to generate pulses.

The inhibit voltage generator 150 may generate a first inhibit voltage Vinhx applied to a non-selected bit line and a second inhibit voltage Vinhy applied to a non-selected word line, based on the inhibit control signal CTRL_inh. In the present embodiment, a voltage level of at least one of the first and second inhibit voltages Vinhx and Vinhy may be changed adaptively to a variation of the node voltage VN at the connection node CN between the selected word line or the selected bit line and the write/read circuit 120.

In the present embodiment, the normal voltage generator 140 and the inhibit voltage generator 150 are shown as separate functional blocks; however, the normal voltage generator 140 and the inhibit voltage generator 150 may be realized as one functional block. This will be described below with reference to FIG. 23.

The row decoder 160 is connected to the memory cell array 110 via the plurality of word lines WL, and may activate a selected word line from among the plurality of word lines, in response to the row address X_ADDR transmitted from the control logic 130. In particular, the row decoder 160 may control the voltage applied to the selected word line or a connecting relation of the selected word line, in response to the row address X_ADDR.

The column decoder 170 is connected to the memory cell array 110 via the plurality of bit lines BL, and may activate a selected bit line from among the plurality of bit lines, in response to the column address Y_ADDR transmitted from the control logic 130. In particular, the column decoder 170 may control the voltage applied to the selected bit line or a connecting relation of the selected bit line, in response to the column address Y_ADDR.

Figure 6A:
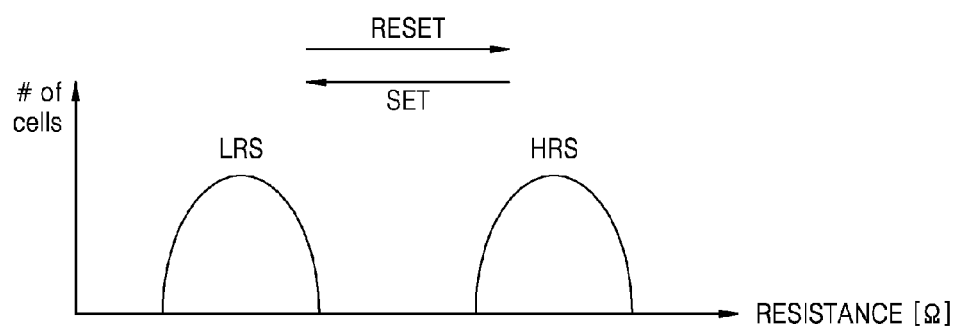
FIG. 6A is a graph showing a distribution of memory cells according to resistances thereof when the memory cell of FIG. 3 is a single level cell.

FIG. 6A is a graph of a distribution of memory cells MC according to resistances thereof, when the memory cell MC of FIG. 3 is a single level cell.

Referring to FIG. 6A, a horizontal axis denotes resistance, and a vertical axis denotes the number of memory cells MC. For example, if the memory cell MC is a single level cell (SLC) programmed with one bit, the memory cell MC may have a low resistance state LRS or a high resistance state HRS.

The low resistance state LRS and the high resistance state HRS may respectively correspond to data '0' and data '1'. In one embodiment, a resistance level R may increase from data '0' to data '1'. That is, the low resistance state LRS may correspond to the data '0', and the high resistance state HRS may correspond to the data '1'.

An operation of applying a write pulse to the memory cell MC to switch the memory cell MC from the high resistance state HRS to the low resistance state LRS is referred to as a set operation or a set writing operation. Also, an operation of applying a write pulse to the memory cell MC to switch the memory cell MC from the low resistance state LRS to the high resistance state HRS is referred to as a reset operation or a reset writing operation.

Figure 6B:
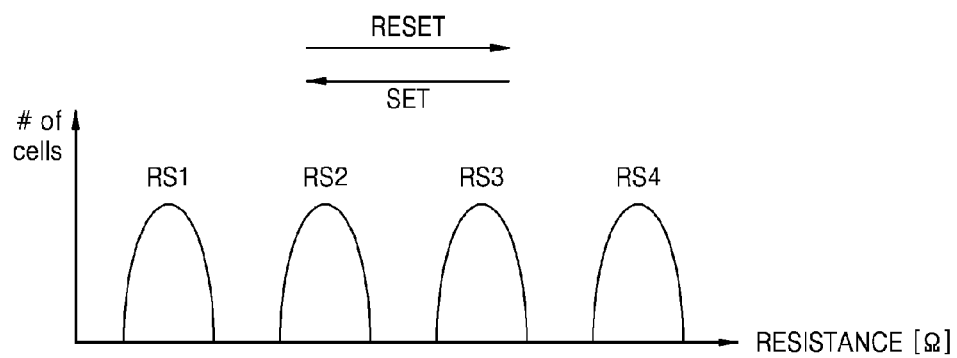
FIG. 6B is a graph showing a distribution of memory cells according to resistances thereof when the memory cell of FIG. 3 is a multi-level cell.

FIG. 6B is a graph showing a distribution of the memory cells MC according to resistances thereof, if the memory cell MC of FIG. 3 is a multi-level cell.

Referring to FIG. 6B, a horizontal axis denotes resistance, and a vertical axis denotes the number of memory cells MC. For example, if the memory cell MC is a multi-level cell (MLC) that is programmed with two bits, the memory cell MC may have one of a first resistance state RS1, a second resistance state RS2, a third resistance state RS3, and a fourth resistance state RS4.

However, one or more embodiments of the present application are not limited thereto, that is, a plurality of memory cells may include triple level cells (TLCs) storing data of 3 bits, and accordingly, each of the memory cells may have one of eight resistance states. In another embodiment, the plurality of memory cells may include memory cells, each storing data of 4 bits or greater.

When comparing with the SLC, the MLC has narrower intervals between resistance distributions, and thus, reading errors may occur due to a small change in the resistance in the MLC. Therefore, resistance states RS1, RS2, RS3, and RS4 may respectively have resistor ranges that do not overlap with each other in order to ensure a read margin.

Each of the first, second, third, and fourth resistance states RS1, RS2, RS3, and RS4 may correspond to one of data '00', data '01', data '10', and data '11'. In the present embodiment, a resistance level R may increase in order of the data '11', the data '01', the data '00', and the data '10'. That is, the first resistance state RS1 may correspond to the data '11', the second resistance state RS2 may correspond to the data '01', the third resistance state RS3 may correspond to the data '00', and the fourth resistance state RS4 may correspond to the data '10'.

Figure 7:
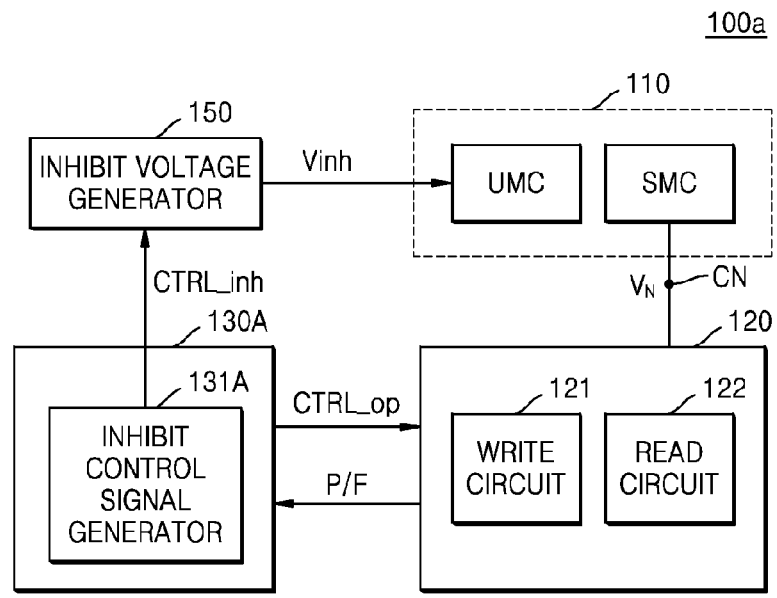
FIG. 7 is a block diagram of a memory device including a control logic according to an embodiment of the application.

FIG. 7 is a block diagram of a memory device 100a including a control logic 130A according to another embodiment of the application.

Referring to FIG. 7, the memory device 100a may include the memory cell array 110, the write/read circuit 120, the control logic 130A, and the inhibit voltage generator 150. The memory device 100a of the present embodiment is a modified example of the memory device 100 of FIG. 2, and thus, descriptions with reference to FIG. 2 may be applied to the present embodiment. Also, although not shown in FIG. 7, the components included in the memory device 100 of FIG. 2 may be included in the memory device 100a of the present embodiment.

The memory cell array 110 may include selected memory cells SMC and unselected memory cells UMC. The selected memory cells SMC may be connected to the write/read circuit 120, and the unselected memory cells UMC may be connected to the inhibit voltage generator 150 to receive the inhibit voltage Vinh.

The control logic 130A may include an inhibit control signal generator 131A. The inhibit control signal generator 131A may determine the inhibit voltage Vinh so that the voltage level of the inhibit voltage Vinh may be changed when the number of times of executing the programming loops increases. In addition, the inhibit control signal generator 131A may generate an inhibit control signal CTRL_inh so that the inhibit voltage generator 150 may generate the inhibit voltage Vinh that changes according to the number of times of executing the programming loops.

As described above with reference to FIGS. 1 and 2, the voltage VN of the connection node CN between the selected memory cell SMC and the write/read circuit 120 may be increased or reduced according to an increase in the number of times of executing the programming loops increases. In the present embodiment, the inhibit control signal generator 131A may determine the voltage level of the inhibit voltage Vinh to vary depending on the programming loop, based on a predicted change in the node voltage VN at the connection node CN according to the programming loop. That is, the inhibit control signal generator 131A may determine the inhibit voltage Vinh according to the number of times of executing the programming loops, without regard to the actual change in the node voltage VN of the connection node CN.

Figure 8:
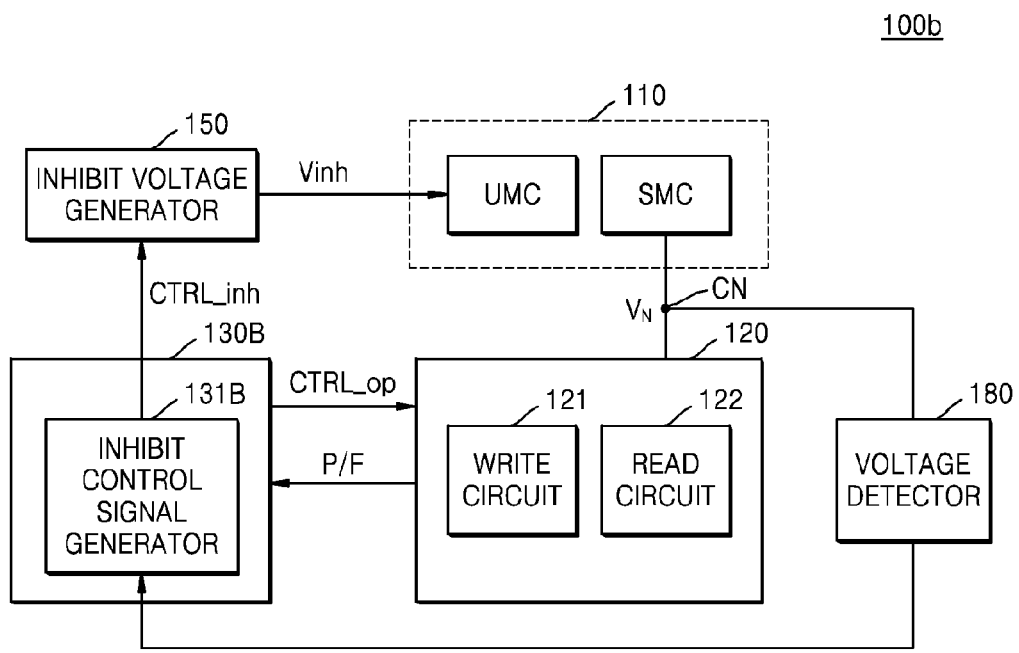
FIG. 8 is a block diagram of a memory device including a control logic according to another embodiment of the application.

FIG. 8 is a block diagram of a memory device 100b including a control logic 130B according to another embodiment of the application.

Referring to FIG. 8, the memory device 100b may include the memory cell array 110, the write/read circuit 120, the control logic 130B, the inhibit voltage generator 150, and a voltage detector 180. The memory device 100b of the present embodiment is a modified example of the memory device 100 of FIG. 2, and thus, descriptions with reference to FIG. 2 may be applied to the present embodiment. Also, although not shown in FIG. 8, the components included in the memory device 100 of FIG. 2 may be included in the memory device 100b of the present embodiment.

The memory cell array 110 may include selected memory cells SMC and unselected memory cells UMC. The selected memory cells SMC may be connected to the write/read circuit 120, and the unselected memory cells UMC may be connected to the inhibit voltage generator 150 to receive the inhibit voltage Vinh.

The voltage detector 180 may detect the node voltage VN of the connection node CN between the selected memory cell SMC and the write/read circuit 120, and may provide the inhibit control signal generator 131B with the detected node voltage VN. In the present embodiment, the voltage detector 180 may detect the node voltage VN at the connection node CN while a verification operation is performed in each of the programming loops. In another embodiment, the voltage generator 180 may detect the node voltage VN at the connection node CN right after the programming operation, without regard to the verification operation in each of the programming loops.

The control logic 130B may include the inhibit control signal generator 131B. The inhibit control signal generator 131B may determine the inhibit voltage Vinh so that the voltage level of the inhibit voltage Vinh may vary depending on the programming loop and based on the node voltage VN of the connection node CN. In addition, the inhibit control signal generator 131B may generate an inhibit control signal CTRL_inh so that the inhibit voltage generator 150 may generate the inhibit voltage Vinh, the voltage level of which is changed according to the number of times of executing the programming loops.

As described above with reference to FIGS. 1 and 2, the node voltage VN at the connection node CN between the selected memory cell SMC and the write/read circuit 120 may increase or decrease according to an increase in the number of times of executing the programming loops. In the present embodiment, the inhibit control signal generator 131B may determine the voltage level of the inhibit voltage Vinh to be different from that expected based solely upon the programming loops, using the actual change in the node voltage VN of the connection node CN according to the programming loops.

Figure 9:
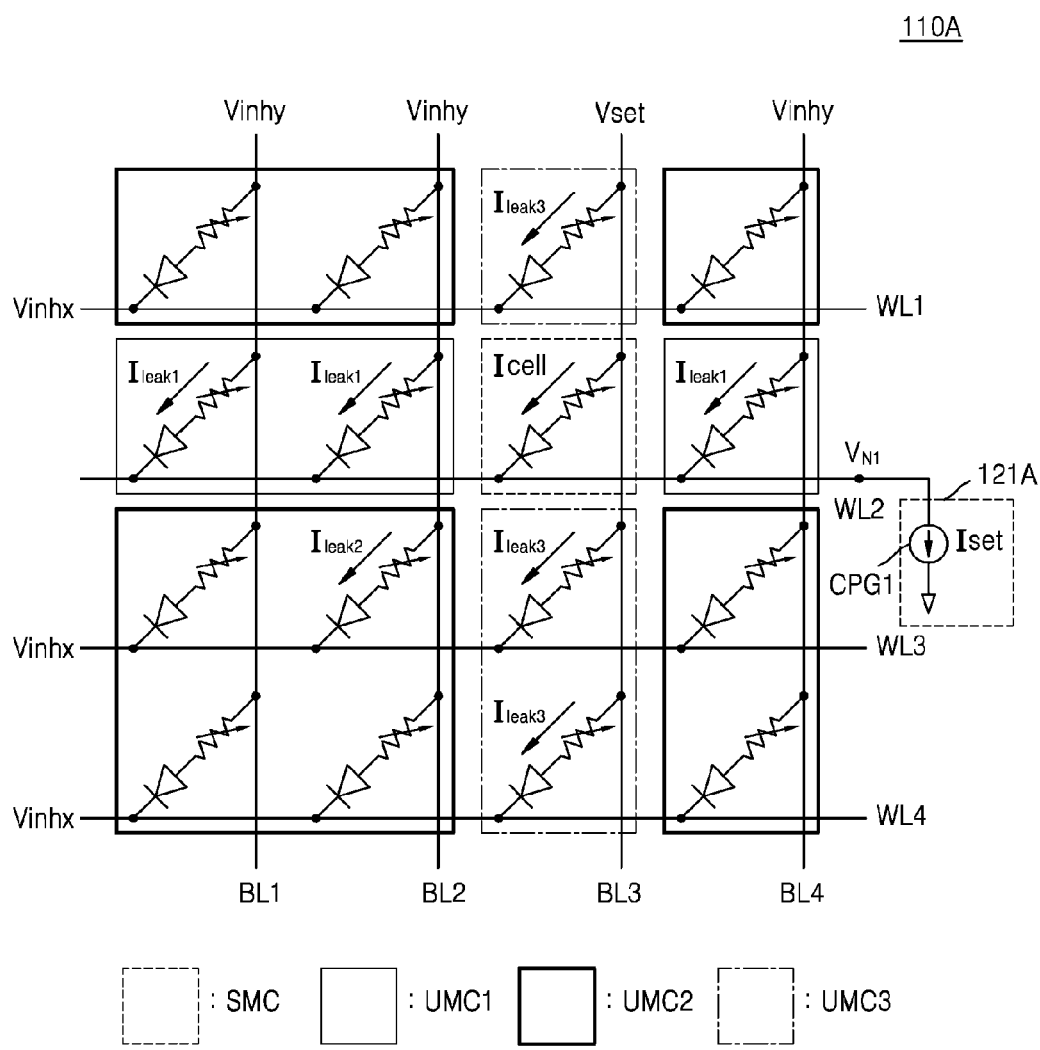
FIG. 9 is a circuit diagram showing a connecting relation between a memory cell array and a write circuit during a set writing operation, according to an embodiment of the application.

FIG. 9 is a circuit diagram showing a connecting relation between a memory cell array 110A and a write circuit 121A during a set writing operation according to an embodiment of the application.

Referring to FIG. 9, the write circuit 121A may include a current pulse generator CPG1 that may generate a set current Iset, an amplitude or a pulse width of which increases according to the number of times of executing the programming loops. The write circuit 121A may be connected to the selected word line SWL (WL2), and the set current may be provided to the selected memory cell SMC via the selected word line SWL.

For example, according to the address ADDR provided from the memory controller 200, the selected bit line SBL is a third bit line BL3, and the selected word line SWL may be a second word line WL2. Here, first, second, and fourth bit lines BL1, BL2, and BL4 may be unselected bit lines UBL, and first, third, and fourth word lines WL1, WL3, and WL4 may be unselected word lines.

The write circuit 121A may be connected to the second word line WL2 to provide the selected memory cell SMC with the set current Iset via the second word line WL2. Accordingly, the set writing operation, in which the resistance of the selected memory cell SMC is reduced, may be performed.

Hereinafter, memory cells arranged on regions where the unselected bit lines BL1, BL2, and BL4 and the selected word line WL2 cross each other are first unselected memory cells UMC1. The first unselected memory cells UMC1 may be referred to as half-selected memory cells. Here, leakage current that may occur in the first unselected memory cells UMC1 is first leakage current Ileak1.

Also, memory cells arranged on regions where the unselected bit lines BL1, BL2, and BL4 and the unselected word lines WL1, WL3, and WL4 cross each other are second unselected memory cells UMC2. Here, leakage current that may occur in the second unselected memory cells UMC2 is second leakage current Ileak2.

Also, memory cells arranged on regions where unselected word lines WL1, WL3, and WL4 and the selected bit line BL3 cross each other are third unselected memory cells UMC3. The third unselected memory cells UMC3 may be referred to as half-selected memory cells. Here, leakage current that may occur in the third unselected memory cells UMC3 is third leakage current Ileak3.

Figure 10A:
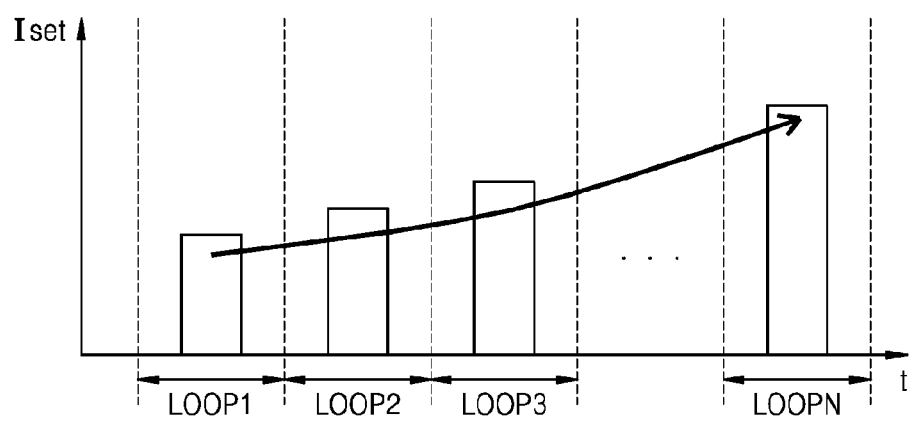
FIG. 10A is a graph of an example of a set current provided by the write circuit of FIG. 9.

FIG. 10A is a graph showing an example of the set current Iset provided from the write circuit 121A of FIG. 9.

Referring to FIG. 10A, a horizontal axis denotes time and a vertical axis denotes magnitude of the set current Iset. In the present embodiment, the set current Iset may include a plurality of pulses having amplitudes that are gradually increased according to the increase in the number of times of executing the programming loops. However, one or more embodiments of the application are not limited thereto. That is, in another embodiment, the set current Iset may include a plurality of pulses having pulse widths that are gradually increased according to the increase in the number of times of executing the programming loops. Also, in another embodiment, the set current Iset may include a plurality of pulses having the amplitudes or the pulse widths that are gradually increased according to the increase in the number of times of executing the programming loops.

Figure 10B:
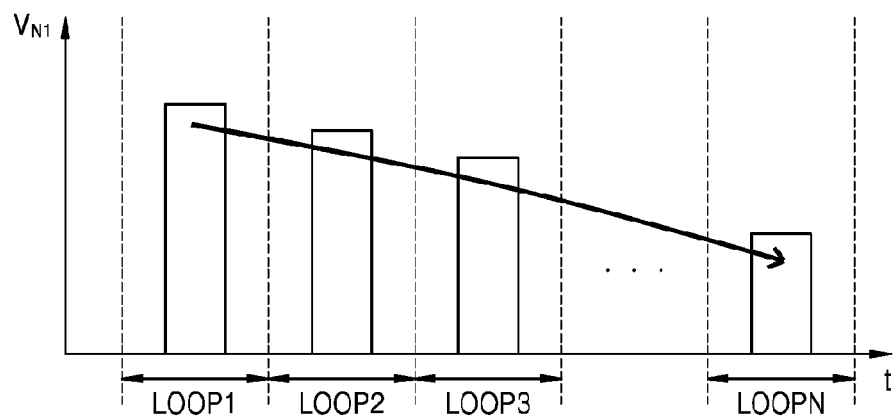
FIG. 10B is a graph showing an example of a node voltage at a connecting node between the write circuit of FIG. 9 and a selected word line.

FIG. 10B is a graph showing an example of a node voltage VN1 at a connection node CN1 between the write circuit 121A of FIG. 9 and the selected word line.

Referring to FIG. 10B, the horizontal axis denotes time and the vertical axis denotes the node voltage VN1 at the connection node CN1 between the write circuit 121A and the selected word line. In the present embodiment, as the set current Iset increases, the node voltage VN1 at the connection node CN1 between the write circuit 121A and the selected word line may be reduced. That is, the node voltage VN1 at the connection node CN1 is changed in inverse-proportional to the set current Iset.

Therefore, if the first inhibit voltage Vinhy applied to the non-selected bit lines BL1, BL2, and BL4 is constant, a voltage difference between the node voltage VN1 of the connection node CN1 and the first inhibit voltage Vinhy is increased. As such, the first leakage current Ileak1 that may occur in the first unselected memory cells DMC1 arranged respectively on the regions where the second word line WL2 and the unselected bit lines BL1, BL2, and BL4 cross each other may be increased.

Figure 11:
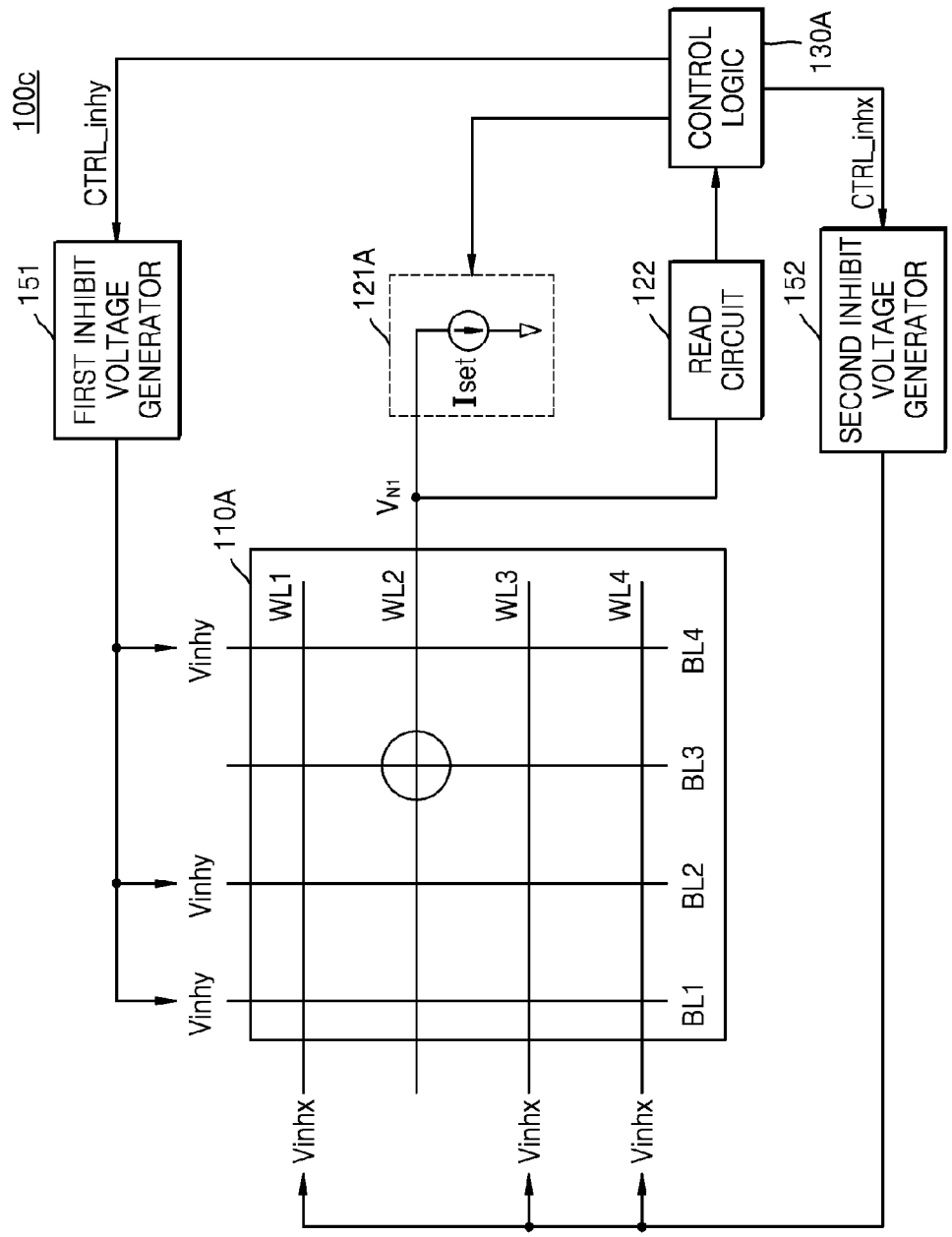
FIG. 11 is a block diagram of an example of the memory device including the memory cell array and the write circuit of FIG. 9.

FIG. 11 is a block diagram of an example of a memory device (100c) including the memory cell array 110A and the write circuit 121A of FIG. 9.

Referring to FIG. 11, the memory device 100c may include the memory cell array 110A, the write circuit 121A, the read circuit 122, the control logic 130A, and the first and second inhibit voltage generators 151 and 152. Here, the first and second inhibit voltage generators 151 and 152 may be included in the inhibit voltage generator 150 of FIG. 2. The memory device 100c according to the present embodiment is an example of the memory device 100 of FIG. 2, and thus, the descriptions with reference to FIG. 2 may be applied to the present embodiment. Also, although not shown in FIG. 11, the components included in the memory device 100 of FIG. 2 may be applied in the memory device 100c according to the present embodiment.

As described above with reference to FIGS. 10A and 10B, the write circuit 121A may provide the set current Iset that increases according to the number of times of executing the programming loops, and accordingly, the node voltage VN1 at the connection node CN1 between the selected word line WL2 and the write circuit 121A may be reduced according to the number of times of executing the programming loops.

The control logic 130A may generate the first inhibit control signal CTRL_inhy so that the voltage level of the first inhibit voltage Vinhy applied to the unselected bit lines BL1, BL2, and BL4 may be reduced according to the number of times of executing the programming loops. In particular, the control logic 130A may determine the first inhibit voltage Vinhy to have a voltage level that is equal to or less than the node voltage VN1.

In the present embodiment, the control logic 130A may determine the first inhibit voltage Vinhy so that the voltage difference between the unselected bit lines BL1, BL2, and BL4 and the selected word line WL2 may be equal to or less than a threshold voltage of the selection device D included in each of the first unselected memory cells UMC1.

The first inhibit voltage generator 151 may generate the first inhibit voltage Vinhy that is gradually reduced according to the number of times of executing the programming loops, based on the first inhibit control signal CTRL_inhy. However, one or more embodiments of the application are not limited thereto, and in another embodiment, the first inhibit voltage Vinhy is slowly reduced according to the number of times of executing the programming loops, based on the first inhibit control signal CTRL_inhy.

Therefore, the voltage difference between the unselected bit lines BL1, BL2, and BL4 and the selected word line WL2 may be constantly maintained. Accordingly, the first unselected memory cells UMC1 arranged at the regions where the unselected bit lines BL1, BL2, and BL4 and the selected word line WL2 cross each other may not have the first leakage current Ileak1.

In addition, since the first inhibit voltage Vinhy applied to the unselected bit lines BL1, BL2, and BL4 is reduced according to the number of times of executing the programming loops, the voltage difference between the unselected bit lines BL1, BL2, and BL4 and the unselected word lines WL1, WL3, and WL4 may increase. As such, the second leakage current Ileak2 may occur in the second unselected memory cells UMC2 that are arranged on the regions where the unselected bit lines BL1, BL2, and BL4 and the unselected word lines WL1, WL3, and WL4 cross.

Therefore, in the present embodiment, the control logic 130A may further generate a second inhibit control signal CTRL_inhx so that the voltage level of the second inhibit voltage Vinhx applied to the unselected word lines WL1, WL3, and WL4 may be reduced according to the number of performing the programming loops. In particular, the control logic 130A may determine the second inhibit voltage Vinhx to be equal to or less than the first inhibit voltage Vinhy.

In one embodiment, the control logic 130A may determine the second inhibit voltage Vinhx so that the voltage difference between the unselected word lines WL1, WL3, and WL4 and the unselected bit lines BL1, BL2, and BL4 may be equal to or less than the threshold voltage of the selection device D included in each of the second unselected memory cells UMC2.

The second inhibit voltage generator 152 may generate the second inhibit voltage Vinhx that is gradually reduced according to the number of performing the programming loops, based on the second inhibit control signal CTRL_inhx. However, one or more embodiments of the application are not limited thereto. In another embodiment, the second inhibit voltage generator 152 may generate the second inhibit voltage Vinhx that is slowly reduced according to the number of performing the programming loops, based on the second inhibit control signal CTRL_inhx.

Therefore, the voltage difference between the unselected bit lines BL1, BL2, and BL4 and the unselected word lines WL1, WL3, and WL4 may be constantly maintained. Accordingly, the second unselected memory cells UMC2 that are arranged on the regions where the unselected word lines WL1, WL3, and WL4 and the unselected bit lines BL1, BL2, and BL4 cross each other may not have the second leakage current Ileak2.

Moreover, the control logic 130A may determine the second inhibit voltage Vinhx so that the voltage difference between the unselected word lines WL1, WL3, and WL4 and the selected bit line BL3 may be equal to or less than the threshold voltage of the selection device D included in each of the third unselected memory cells UMC3. As such, the voltage difference between the unselected word lines WL1, WL3, and WL4 and the selected bit line BL3 may be constantly maintained, and accordingly, the third unselected memory cells UMC3 may not have the third leakage current Ileak3.

As described above, the first and second inhibit voltage generators 151 and 152 may respectively generate the first and second inhibit voltages Vinhy and Vinhx that are reduced according to the number of performing the programming loops. However, one or more embodiments of the application are not limited thereto, that is, the first inhibit voltage generator 151 may generate the first inhibit voltage Vinhy the voltage level of which is reduced according to the number of performing the programming loops, and the second inhibit voltage generator 152 may generate the second inhibit voltage Vinhx having the voltage level that is constant regardless of the number of performing the programming loops.

Figure 12:
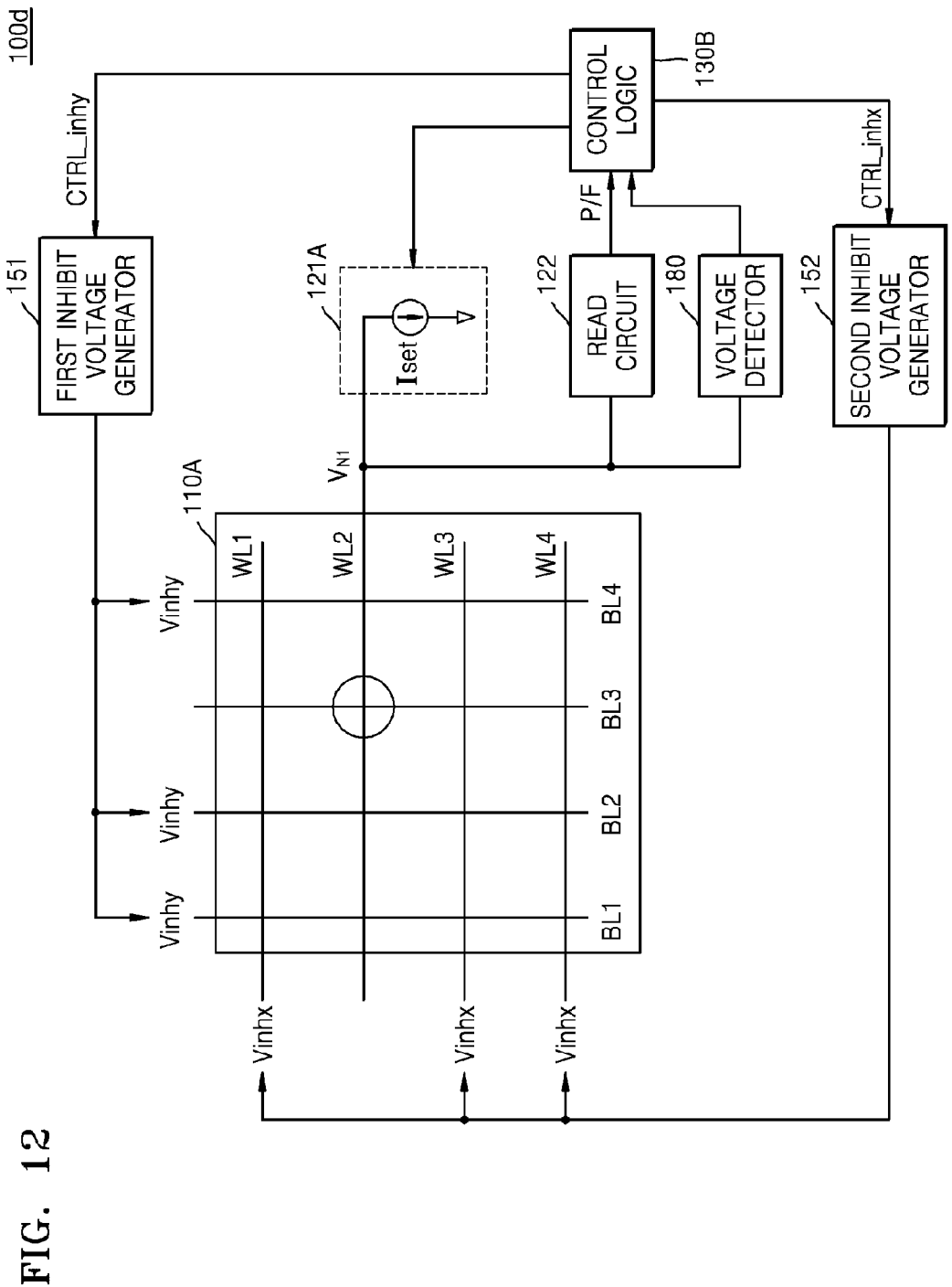
FIG. 12 is a block diagram of another example of the memory device including the memory cell array and the write circuit of FIG. 9.

FIG. 12 is a block diagram of another example of the memory device (100d) including the memory cell array 110A and the write circuit 121A shown in FIG. 9.

Referring to FIG. 12, the memory device 100d may include the memory cell array 110A, the write circuit 121A, the read circuit 122, the control logic 130B, the first and second inhibit voltage generators 151 and 152, and a voltage detector 180. As described above, the memory device 100d of the present embodiment may further include the voltage detector 180 when comparing with the memory device 100c of FIG. 11. Therefore, hereinafter, differences between the memory device 100d of the present embodiment and the memory device 100c of FIG. 11 will be described below.

The voltage generator 180 detects the node voltage VN1 of the connection node CN1 between the selected word line WL2 and the write circuit 121A, and then, provides the detected node voltage VN1 to the control logic 130B. In one embodiment, the voltage detector 180 may detect the node voltage VN1 of the connection node CN1 in each of the programming loops. In another embodiment, the voltage detector 180 may detect the node voltage VN1 of the connection node CN1 in only some of the plurality of programming loops.

The control logic 130B may generate the first inhibit control signal CTRL_inhy so that the voltage level of the first inhibit voltage Vinhy may be reduced according to the programming loops, based on the detected node voltage VN1 of the connection node CN1. In particular, the control logic 130B may determine the first inhibit voltage Vinhy to have the voltage level that is equal to or less than the node voltage VN1.

In one embodiment, the control logic 130B may determine the first inhibit voltage Vinhy so that the voltage difference between the unselected bit lines BL1, BL2, and BL4 and the selected word line WL2 may be equal to or less than the threshold voltage of the selection device D included in each of the first unselected memory cells UMC1.

Also, the control logic 130B may further generate the second inhibit control signal CTRL_inhx so that the voltage level of the second inhibit voltage Vinhx applied to the unselected word lines WL1, WL3, and WL4 may be reduced according to the number of performing the programming loops, based on the node voltage VN1 of the connection node CN1. In particular, the control logic 130B may determine the second inhibit voltage Vinhx to have the voltage level that is equal to or less than the first inhibit voltage Vinhy.

In one embodiment, the control logic 130B may determine the second inhibit voltage Vinhx so that the voltage difference between the unselected word lines WL1, WL3, and WL4 and the unselected bit lines BL1, BL2, and BL4 may be equal to or less than the threshold voltage of the selection device D included in each of the second unselected memory cells UMC2.

Moreover, the control logic 130B may determine the second inhibit voltage Vinhx so that the voltage difference between the unselected word lines WL1, WL3, and WL4 and the selected bit line BL3 may be equal to or less than the threshold voltage of the selection device D included in each of the third unselected memory cells UMC3.

Figure 13A:
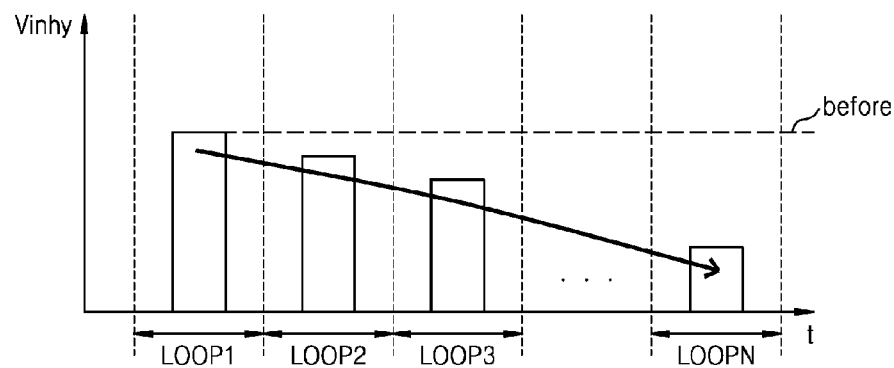
FIG. 13A is a graph of an example of a first inhibit voltage in the memory device of FIG. 11 and the memory device of FIG. 12.

FIG. 13A is a graph showing an example of the first inhibit voltage Vinhy in the memory device 100c of FIG. 11 and in the memory device 100d of FIG. 12.

Referring to FIG. 13A, a horizontal axis denotes time, and a vertical axis denotes the first inhibit voltage Vinhy. Traditionally, the first inhibit voltage Vinhy is constantly maintained without regard to the time, that is, the increase in the number of performing the programming loops. However, according to the present embodiment, the voltage level of the first inhibit voltage Vinhy is gradually reduced when the number of performing the programming loops increases. That is, the first inhibit voltage Vinhy is changed adaptively with the change in the node voltage VN1 of the connection node CN1. In another embodiment, the first inhibit voltage Vinhy may be slowly reduced when the number of performing the programming loops increases.

Figure 13B:
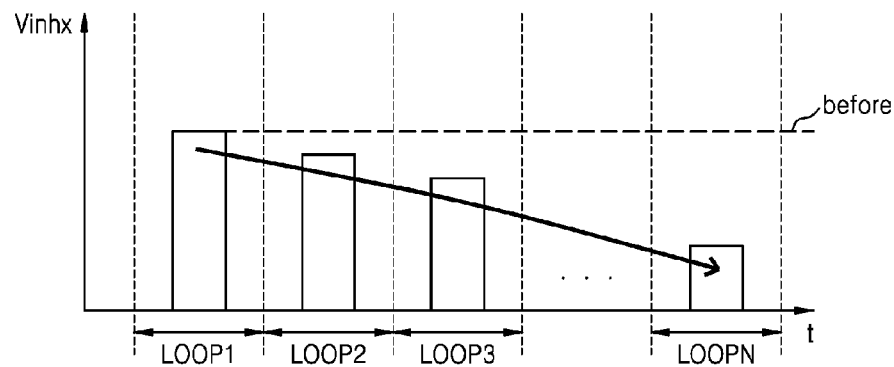
FIG. 13B is a graph of an example of a second inhibit voltage in the memory device of FIG. 11 and the memory device of FIG. 12.

FIG. 13B is a graph showing an example of the second inhibit voltage Vinhx in the memory device 100c of FIG. 11 and in the memory device 100d of FIG. 12.

Referring to FIG. 13B, a horizontal axis denotes time and a vertical axis denotes the second inhibit voltage Vinhx. Traditionally, the second inhibit voltage Vinhx is constantly maintained without regard to the time, that is, the increase in the number of performing the programming loops. However, according to the present embodiment, the voltage level of the second inhibit voltage Vinhx is gradually reduced when the number of performing the programming loops increases. That is, the second inhibit voltage Vinhx is changed adaptively with the change in the node voltage VN1 of the connection node CN1. In another embodiment, the second inhibit voltage Vinhx may be slowly reduced when the number of performing the programming loops increases.

Figure 14:
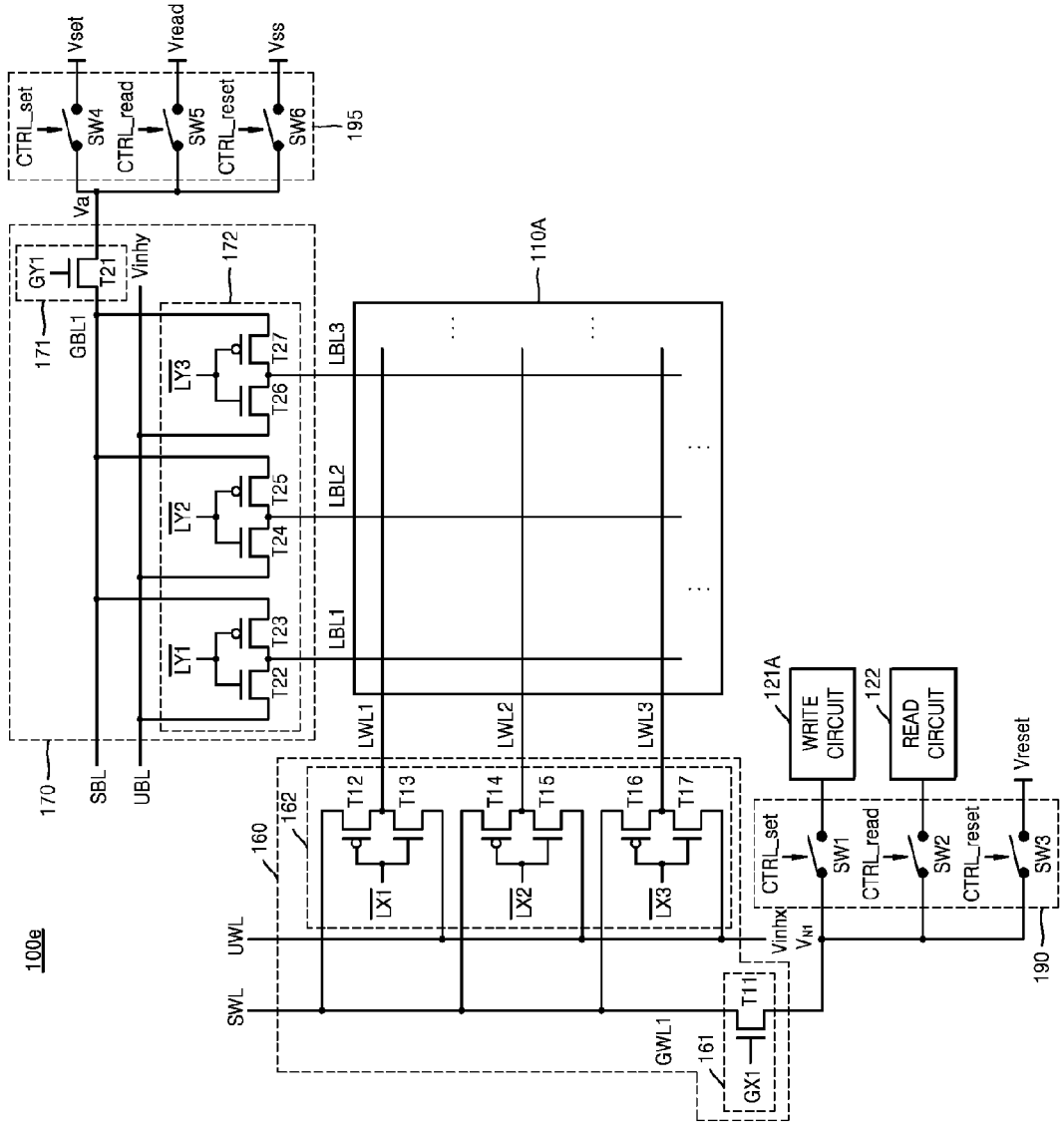
FIG. 14 is a circuit diagram of an example of the memory device including the memory cell array and the write circuit of FIG. 9.

FIG. 14 is a circuit diagram showing an example of the memory device (100e) including the memory cell array 110A and the write circuit 121A of FIG. 9.

Referring to FIG. 14, the memory device 100e includes the memory cell array 110A, the write circuit 121A, the read circuit 122, the row decoder 160, the column decoder 170, and first and second switching units 190 and 195. The memory device 100e of the present embodiment is an example of the memory device 100 shown in FIG. 2, and the descriptions with reference to FIG. 2 may be applied to the present embodiment. Also, although not shown in FIG. 14, the components included in the memory device 100 of FIG. 2 may be also included in the memory device 100e of the present embodiment.

The row decoder 160 may include a first row decoder 161 and a second row decoder 162. The first row decoder 161 may activate a first global word line GWL1 in response to a first global row address GX1. The first row decoder 161 may include a transistor T11, and may be referred to as a global row switch. For example, if the first global row address GX1 is '1', the first row decoder 161 may connect the first global word line GWL1 to the first switching unit 190.

The second row decoder 162 may activate first through third local word lines LWL1, LWL2, and LWL3 in response to first through third local row addresses LX1, LX2, and LX3. The first through third local word lines LWL1, LWL2, and LWL3 may correspond to the word lines WL1, WL2, and WL3 of FIG. 2. The second row decoder 162 may include transistors T12 through T17, and may be referred to as a local row switch. For example, if the first local row address LX1 is '1', the transistor T12 is turned on and the transistor T13 is turned off. As such, the first local word line LWL1 becomes the selected word line SWL, and then is connected to the first switching unit 190. In addition, if the first local row address LX1 is '0', the transistor T12 is turned off and the transistor T13 is turned on. As such, the first local word line LWL1 is the unselected word line UWL, and then, may receive the second inhibit voltage Vinhx.

The first switching unit 190 may include first through third switches SW1, SW2, and SW3. The first switch SW1 is turned on and turned off according to a set selection signal CTRL_set to connect the write circuit 121A to the first global word line GWL1. The second switch SW2 is turned on and turned off according to a read selection signal CTRL_read to connect the read circuit 122 to the first global word line GWL1. The third switch SW3 is turned on and turned off according to a reset selection signal CTRL_reset to connect the normal voltage generator 140 to the first global word line GWL1, and thus, the reset voltage Vreset may be applied to the first global word line GWL1. Here, the set selection signal CTRL_set, the read selection signal CTRL_read, and the reset selection signal CTRL_reset may be provided by the control logic 130.

The column decoder 170 may include a first column decoder 171 and a second column decoder 172. The first column decoder 171 may activate a first global bit line GBL1 in response to a first global column address GY1. The first column decoder 171 may include a transistor T21, and may be referred to as a global column switch. For example, if the first global column address GY1 is '1', the first column decoder 171 may connect the first global bit line GBL1 to the second switching unit 195.

The second column decoder 172 may activate first through third local bit lines LBL1, LBL2, and LBL3 in response to first through third local column addresses LY1, LY2, and LY3. The first through third local bit lines LBL1, LBL2, and LBL3 may correspond to the bit lines BL1, BL2, and BL3 of FIG. 2. The second column decoder 172 may include transistors T22 through T27, and may be referred to as a local column switch. For example, if the first local column address LY1 is '1', the transistor TR23 is turned on and the transistor T22 is turned off. As such, the first local bit line LBL1 is the selected bit line SBL, and is connected to the second switching unit 195. In addition, if the local column address LY1 is '0', the transistor T23 is turned off and the transistor T22 is turned on. As such, the first local bit line LBL1 is the unselected bit line UBL that receives the first inhibit voltage Vinhy.

The second switching unit 195 may include fourth to sixth switches SW4, SW5, and SW6. The fourth switch SW4 is turned on/off according to the set selection signal CTRL_set to connect the normal voltage generator 140 to the first global bit line GBL1, and thus, the set voltage Vset may be applied to the first global bit line GBL1. The fifth switch SW5 is turned on/off according to the read selection signal CTRL_read to connect the normal voltage generator 140 to the first global bit line GBL1, and thus, the read voltage Vread may be applied to the first global bit line GBL1. The sixth switch SW6 is turned on/off according to the reset selection signal CTRL_reset, so that the ground voltage Vss may be applied to the first global bit line GBL1. Here, the set selection signal CTRL_set, the read selection signal CTRL_read, and the reset selection signal CTRL_reset may be provided from the control logic 130.

Figure 15:
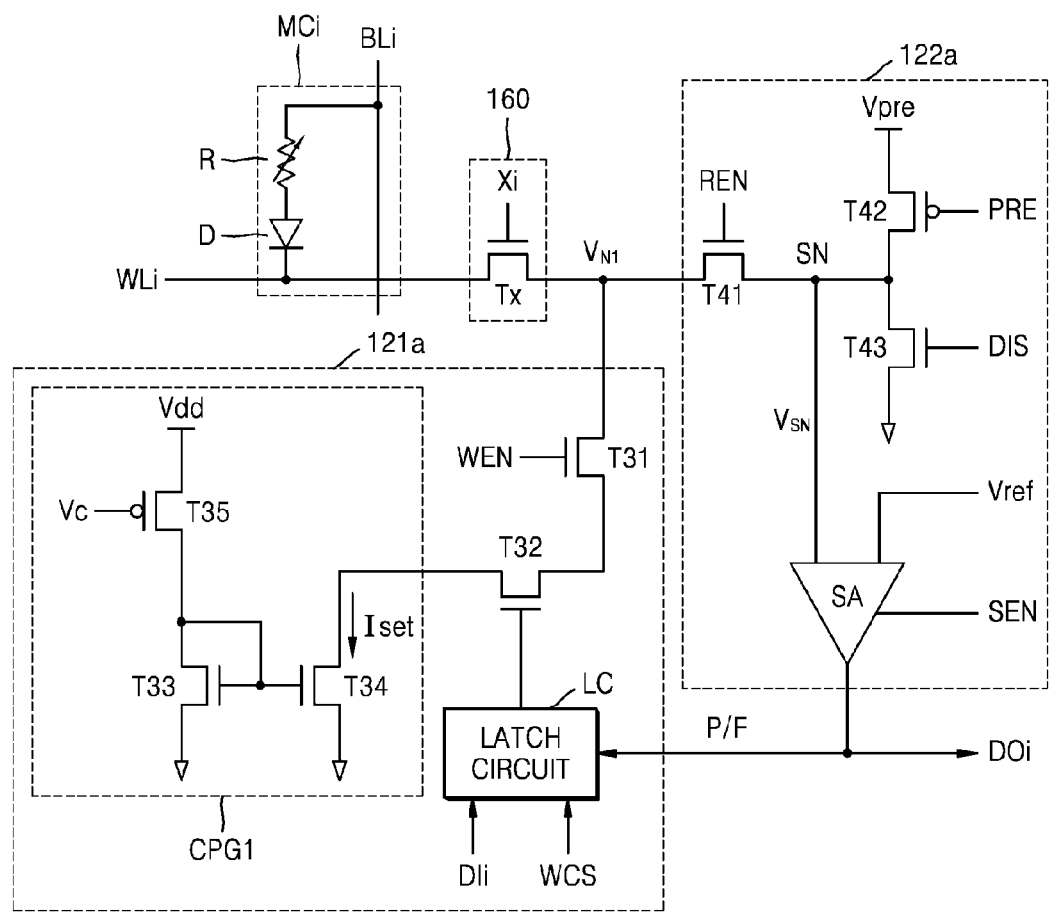
FIG. 15 is a circuit diagram of the write circuit of FIG. 9 in detail.

FIG. 15 is a circuit diagram showing an example of the write circuit (121a) of FIG. 9.

Referring to FIG. 15, a memory cell MCi is arranged on a region where a bit line BLi and a word line WLi cross each other, and may include a variable resistor device R and a selection device D. The row decoder 160 may include a word line selection transistor Tx, and the word line selection transistor Tx may connect the memory cell MCi to the write circuit 121a or a read circuit 122a in response to a row address Xi. Hereinafter, a case where the row address Xi is activated so that the memory cell MCi is connected to the write circuit 121a or the read circuit 122a will be described below.

The write circuit 121a may include first and second transistors T31 and T32, a current pulse provider CPG1, and a latch circuit LC. In the present embodiment, when a write enable signal WEN is activated, the first transistor T31 is turned on, and accordingly, the write circuit 121a may be connected to the memory cell MCi.

The current pulse provider CPG1 may include third to fifth transistors T33, T34, and T35. The third and fourth transistors T33 and T34 form a current mirror, and the fifth transistor T35 may provide the current pulse, that is, the set current Iset, in response to a control voltage Vc applied to a gate of the fifth transistor T35. As such, the write circuit 121a may provide the memory cell MCi with the set current Iset.

In the present embodiment, the control logic 130 may generate the voltage control signal CTRL_vol so that the control voltage Vc may increase according to the increase in the number of performing the programming loops. Accordingly, the current pulse provider CPG1 may provide the set current Iset that increases according to the increase in the number of performing the programming loops.

The latch circuit LC may output a gate voltage in response to a write control signal WCS, so that the second transistor T32 may be selectively turned on according to a logic level of an input bit DIi. In one embodiment, if the write control signal WCS indicates the writing operation in the set direction, the latch circuit LC may turn on the second transistor T32 when the logic level of the input bit DIi is '0' and may turn off the second transistor T32 when the logic level of the input data DIi is '1'. In another embodiment, if the write control signal WCS indicates the writing operation in the reset direction, the latch circuit LC may turn off the second transistor T32 when the logic level of the input data DIi is '0', and may turn on the second transistor T32 when the logic level of the input data DIi is '1'.

The read circuit 122a may include first to third transistors T41, T42, and T43, and a sense amplifier SA. In the present embodiment, when a read enable signal REN is activated, the first transistor T41 is turned on, and accordingly, the read circuit 122a may be connected to the memory cell MCi.

When a precharge signal PRE is deactivated, the second transistor T42 is turned on and the bit line BLi may be pre-charged by the pre-charge voltage Vpre. In addition, when a discharge signal DIS is activated, the third transistor T43 is turned on and the bit line BLi may be initialized by the ground voltage.

The sense amplifier SA is activated according to the sense enable signal SEN to compare a voltage VSN of a sensing node SN with a reference voltage Vref and provide an output bit DOi representing whether the memory cell MCi is in a turned-on state or turned-off state. In a general reading operation, the output bit DOi may be provided to outside of the memory device 100, for example, to the memory controller 200.

In addition, in a verification reading operation for determining whether the writing operation is finished, the output bit DOi may be provided to inside of the memory device 100, for example, the latch circuit LC and the control logic 130, as a pass/fail (P/F) signal representing success/failure of the writing operation. If the pass/fail signal P/F denotes that the writing operation is finished, the latch circuit LC turns off the second transistor T32 regardless of the input bit DIi to terminate the writing operation on the memory cell MCi.

Although not shown in FIG. 15, the write circuit 121a may further include a voltage pulse generator. The voltage pulse generator may receive the control voltage Vc provided from the normal voltage generator 140, and may generate a voltage pulse corresponding to the control voltage Vc to provide the memory cell MCi with the voltage pulse.

Figure 16:
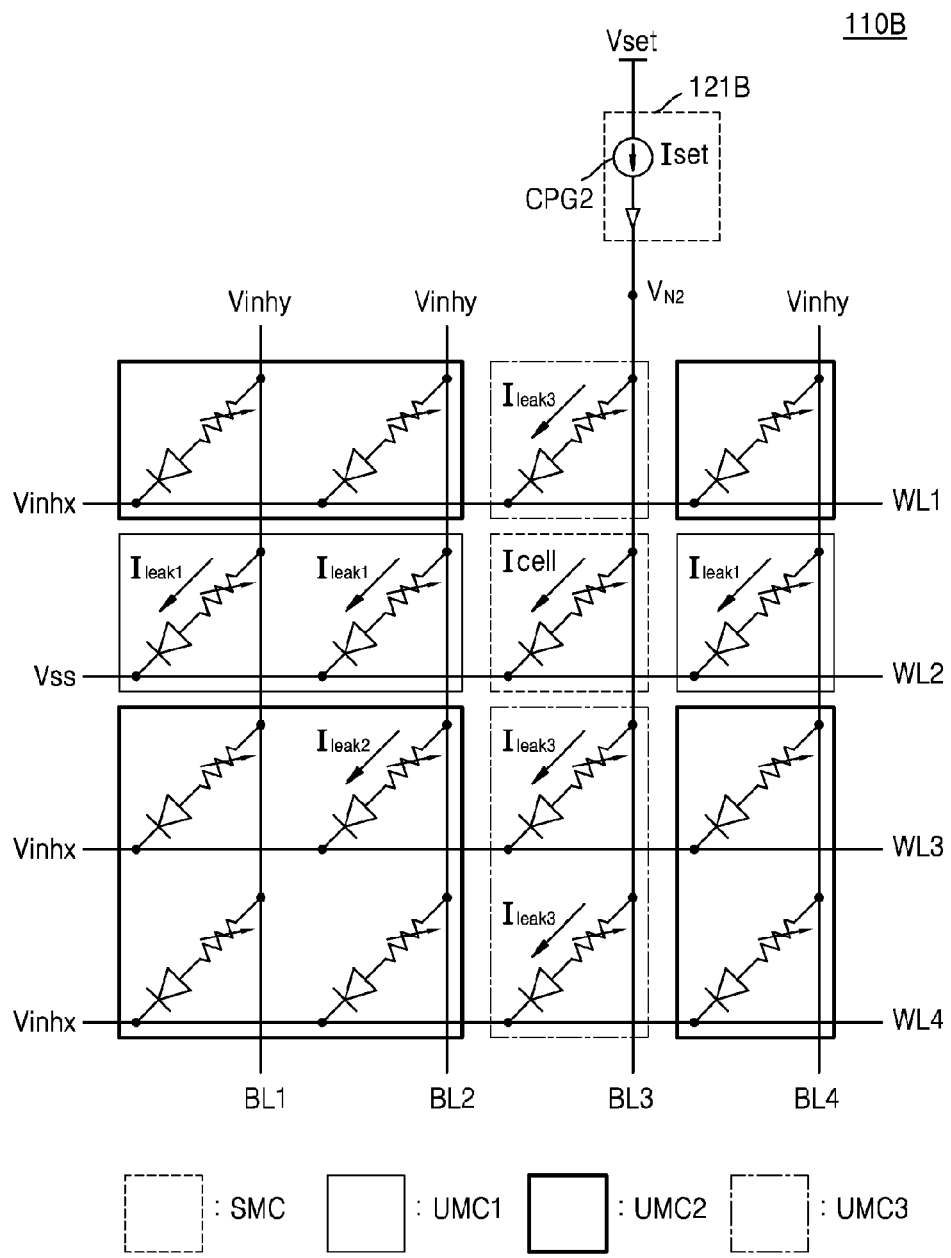
FIG. 16 is a circuit diagram showing a connecting relation between the memory cell array and the write circuit, during a set writing operation according to another embodiment of the application.

FIG. 16 is a circuit diagram showing a connecting relation between a memory cell array 110B and a write circuit 121B, in a set writing operation according to another exemplary embodiment of the application.

Referring to FIG. 16, the write circuit 121B may include a current pulse generator CPG2, and the current pulse generator CPG2 may generate the set current Iset, an amplitude of a pulse width of which is increased according to the number of times of performing the programming loops. The write circuit 121B may be connected to the selected bit line SBL, and may provide the selected memory cell SMC with the set current Iset via the selected bit line SBL.

For example, according to the address ADDR provided from the memory controller 200, the selected bit line SBL may be a third bit line BL3 and the selected word line SWL may be a second word line WL2. Here, the first, second, and fourth bit lines BL1, BL2, and BL4 may be the unselected bit lines, and the first, third, and fourth word lines WL1, WL2, and WL4 may be the unselected word lines UWL.

The write circuit 121B is connected to the third bit line BL3 so as to provide the selected memory cell SMC with the set current Iset via the third bit line BL3. Accordingly, the set writing operation in which the resistance of the selected memory cell SMC is reduced may be performed.

Hereinafter, the memory cells arranged on the regions where the unselected bit lines BL1, BL2, and BL4 and the selected word line WL2 cross each other may be referred to as the first unselected memory cells UMC1. The first unselected memory cells UMC1 may be referred to as half-selected memory cells. Here, leakage current that may occur in the first unselected memory cells UMC1 is the first leakage current Ileak1.

Also, memory cells arranged on regions where the unselected bit lines BL1, BL2, and BL4 and the unselected word lines WL1, WL3, and WL4 cross each other are second unselected memory cells UMC2. Here, leakage current that may occur in the second unselected memory cells UMC2 is second leakage current Ileak2.

Also, memory cells arranged on regions where unselected word lines WL1, WL3, and WL4 and the selected bit line BL3 cross each other are third unselected memory cells UMC3. The third unselected memory cells UMC3 may be referred to as half-selected memory cells. Here, leakage current that may occur in the third unselected memory cells UMC3 is third leakage current Ileak3.

Figure 17A:
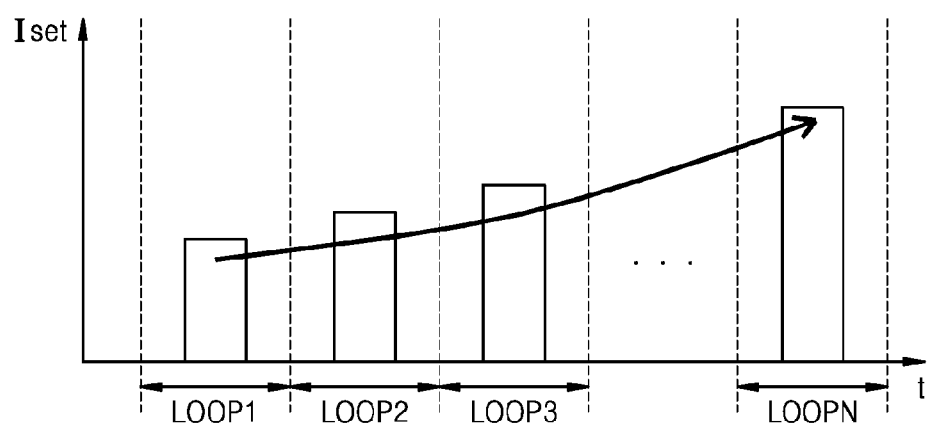
FIG. 17A is a graph of an example of a set current provided by the write circuit of FIG. 16.

FIG. 17A is a graph showing an example of the set current Iset provided by the write circuit 121B of FIG. 16.

Referring to FIG. 17A, a horizontal axis denotes time and a vertical axis denotes the set current Iset. In the present embodiment, the set current Iset may include a plurality of pulses having amplitudes that are gradually increased according to the increase in the number of times of executing the programming loops. However, one or more embodiments of the application are not limited thereto. That is, in another exemplary embodiment, the set current Iset may include a plurality of pulses having pulse widths that are gradually increased according to the increase in the number of times of executing the programming loops. Also, in another exemplary embodiment, the set current Iset may include a plurality of pulses having amplitudes or pulse widths that are non-linearly increased according to the increase in the number of times of executing the programming loops.

Figure 17B:
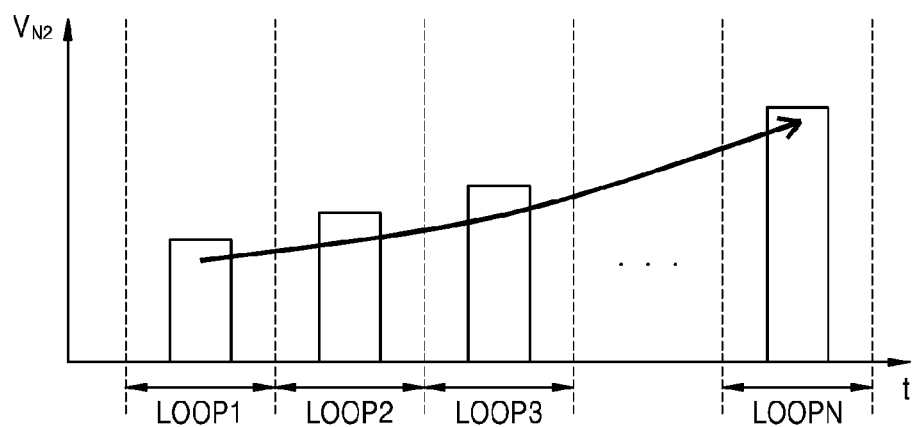
FIG. 17B is a graph of an example of a node voltage at a connecting node between the write circuit of FIG. 16 and a selected bit line.

FIG. 17B is a graph showing an example of a node voltage VN2 of a connection node CN2 between the write circuit 121B of FIG. 16 and the selected bit line SBL.

Referring to FIG. 17B, a horizontal axis denotes time and a vertical axis denotes the node voltage VN2 of the connection node CN2 between the write circuit 121B and the selected bit line SBL. In the present exemplary embodiment, as the set current Iset increases, the node voltage VN2 of the connection node CN2 between the write circuit 121B and the selected bit line SBL increases. That is, the node voltage VN2 of the connection node CN2 is changed in proportional to the set current Iset.

Therefore, if the second inhibit voltage Vinhx applied to the unselected word lines WL1, WL3, and WL4 is constant, the voltage difference between the node voltage VN2 of the connection node CN2 and the second inhibit voltage Vinhx increases. Thus, the third leakage current Ileak3 that may occur in the third unselected memory cells UMC3 arranged on the regions where the third bit line BL3 and the unselected word lines WL1, WL3, and WL4 cross each other may be increased.

Figure 18:
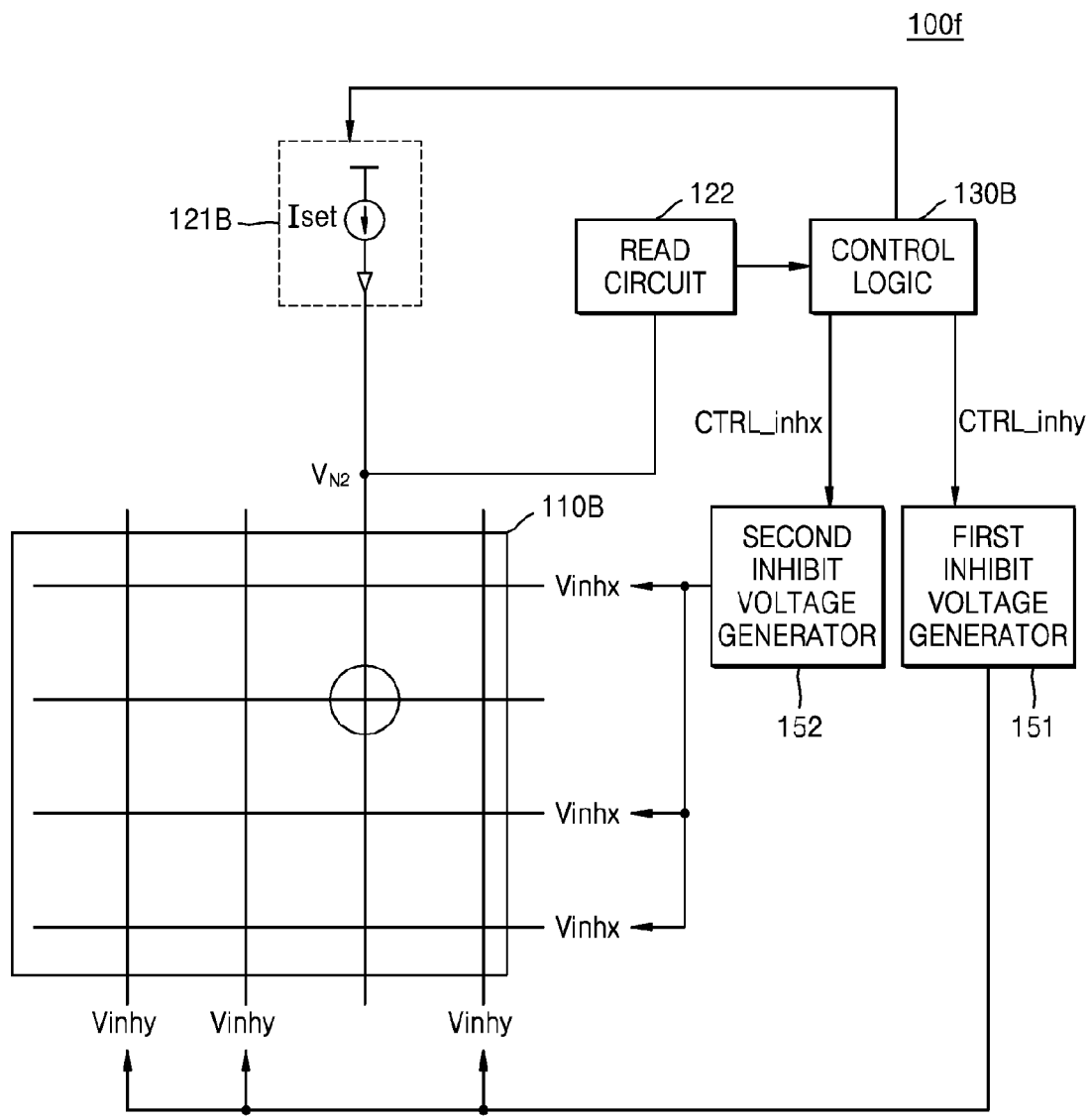
FIG. 18 is a block diagram of a memory device including the memory cell array and the write circuit of FIG. 16.

FIG. 18 is a block diagram of a memory device 100f including the memory cell array 110B and the write circuit 121B of FIG. 16.

Referring to FIG. 18, the memory device 100f includes the memory cell array 110B, the write circuit 121B, the read circuit 122, the control logic 130B, and the first and second inhibit voltage generators 151 and 152. Here, the first and second inhibit voltage generators 151 and 152 may be included in the inhibit voltage generator 150 of FIG. 2. The memory device 100f according to the exemplary embodiment is an example of the memory device 100 of FIG. 2, and the above descriptions with reference to FIG. 2 may be applied to the present exemplary embodiment. Also, although not shown in FIG. 18, the components included in the memory device 100 of FIG. 2 may be included in the memory device 100f of the present embodiment.

As described above with reference to FIGS. 17A and 17B, the write circuit 121B may provide the set current Iset that is increased according to the number of times of executing the programming loops, and accordingly, the node voltage VN2 of the connection node CN2 between the selected bit line BL3 and the write circuit 121B may increase according to the number of times of executing the programming loops.

The control logic 130B may generate the second inhibit control signal CTRL_inhx so that the voltage level of the second inhibit voltage Vinhx applied to the unselected word lines WL1, WL3, and WL4 may be increased according to the number of times of executing the programming loops. In particular, the control logic 130B may determine the second inhibit voltage Vinhx to have the voltage level equal to or greater than the node voltage VN2.

In one embodiment, the control logic 130B may determine the second inhibit voltage Vinhx so that the voltage difference between the unselected word lines WL1, WL3, and WL4 and the selected bit line BL3 may be equal to or less than the threshold voltage of the selection device D included in each of the third unselected memory cells UMC3.

The second inhibit voltage generator 152 may generate the second inhibit voltage Vinhx that is gradually increased according to the number of times of executing the programming loops, based on the second inhibit control signal CTRL_inhx. However, one or more embodiments of the application are not limited thereto, that is, in another embodiment, the second inhibit voltage generator 152 may generate the second inhibit voltage Vinhx that is slowly increased according to the number of times of executing the programming loops, based on the second inhibit control signal CTRL_inhx.

Therefore, the voltage difference between the unselected word lines WL1, WL3, and WL4 and the selected bit line BL3 may be constantly maintained. Accordingly, the third unselected memory cells UMC3 that are arranged on the regions where the unselected word lines WL1, WL3, and WL4 and the selected bit line BL3 cross each other may not have the third leakage current Ileak3.

In addition, since the second inhibit voltage Vinhx applied to the unselected word lines WL1, WL3, and WL4 increases according to the number of times of executing the programming loops, the voltage difference between the unselected word lines WL1, WL3, and WL4 and the unselected bit lines BL1, BL2, and BL4 may increase. As such, the second leakage current Ileak2 may occur in the second unselected memory cells UMC2 that are arranged respectively on the regions where the unselected word lines WL1, WL3, and WL4 and the unselected bit lines BL1, BL2, and BL4 cross each other.

Therefore, in the present embodiment, the control logic 130B may further generate the first inhibit control signal CTRL_inhy so that the voltage level of the first inhibit voltage Vinhy applied to the unselected bit lines BL1, BL2, and BL4 may increase according to the number of times of executing the programming loops. In particular, the control logic 130B may determine the first inhibit voltage Vinhy to be equal to or greater than the second inhibit voltage Vinhx.

In one embodiment, the control logic 130B may determine the first inhibit voltage Vinhy so that the voltage difference between the unselected bit lines BL1, BL2, and BL4 and the unselected word lines WL1, WL3, and WL4 may be equal to or less than the threshold voltage of the selection device D included in each of the second unselected memory cells UMC2.

The first inhibit voltage generator 151 may generate the first inhibit voltage Vinhy that is gradually increased according to the number of times of executing the programming loops based on the first inhibit control signal CTRL_inhy. However, one or more embodiments of the application are not limited thereto, that is, the first inhibit voltage generator 151 may generate the first inhibit voltage Vinhy that is slowly increased according to the number of times of the programming loops, based on the first inhibit control signal CTRL_inhy.

Therefore, the voltage difference between the unselected bit lines BL1, BL2, and BL4 and the unselected word lines WL1, WL3, and WL4 may be constantly maintained, actually. Accordingly, the second unselected memory cells UMC2 arranged on the regions where the unselected word lines WL1, WL3, and WL4 and the unselected bit lines BL1, BL2, and BL4 cross each other may not have the second leakage current Ileak2.

Moreover, the control logic 130B may determine the first inhibit voltage Vinhy so that the voltage difference between the unselected bit lines BL1, BL2, and BL4 and the selected word line WL2 may be equal to or less than the threshold voltage of the selection device D included in each of the first unselected memory cells DMC1. As such, the voltage difference between the unselected bit lines BL1, BL2, and BL4 and the selected word line WL2 may be constantly maintained, and accordingly, the first unselected memory cells DMC1 may not have the first leakage current Ileak1.

As described above, the first and second inhibit voltage generators 151 and 152 may respectively generate the first and second inhibit voltages Vinhy and Vinhx that are increased according to the number of times of executing the programming loops. However, one or more embodiments of the application are not limited thereto. That is, the first inhibit voltage generator 151 may generate the first inhibit voltage Vinhy having a constant voltage level without regard to the number of times of executing the programming loops, and the second inhibit voltage generator 152 may generate the second inhibit voltage Vinhx having the voltage level increasing according to the number of times of executing the programming loops.

Figure 19:
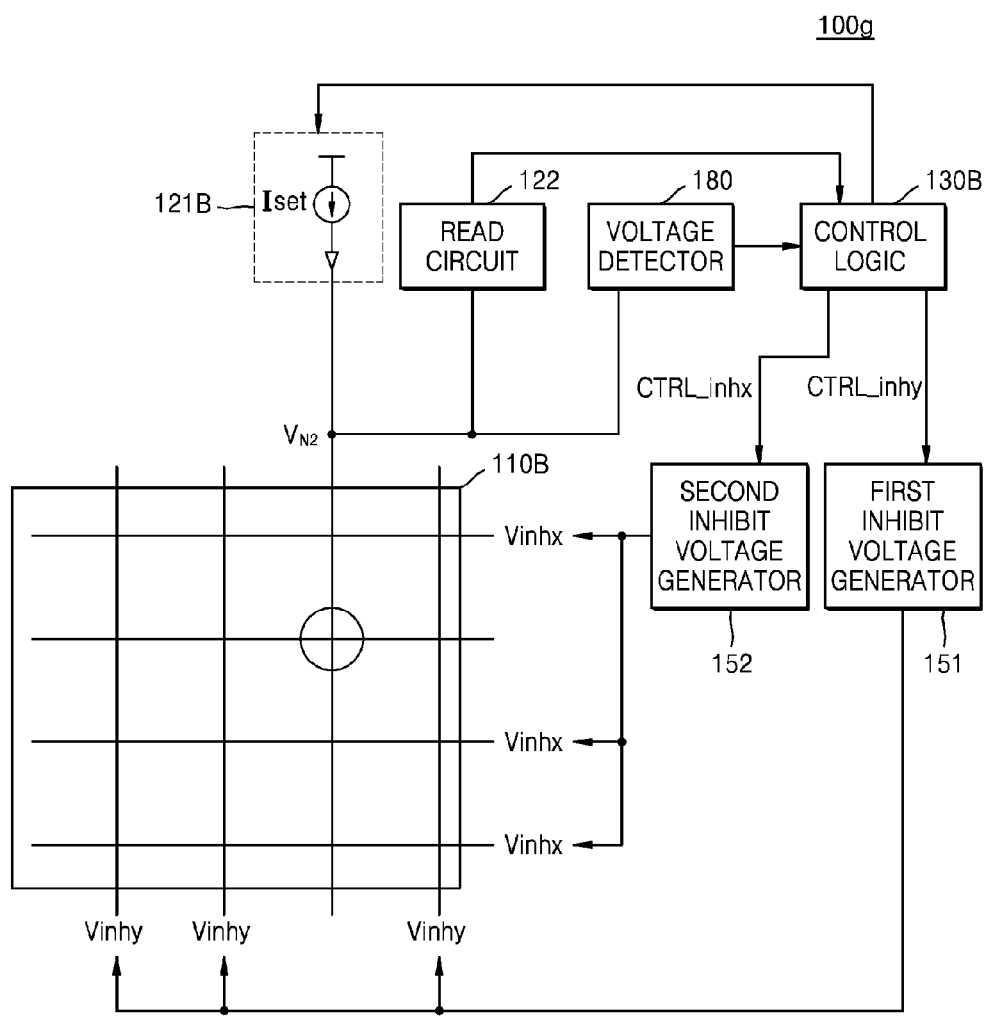
FIG. 19 is a block diagram of another example of the memory device including the memory cell array and the write circuit of FIG. 16.

FIG. 19 is a block diagram of an example of the memory device (100g) including the memory cell array 110B and the write circuit 121B of FIG. 16.

Referring to FIG. 19, the memory device 100g may include the memory cell array 110B, the write circuit 121B, the read circuit 122, the control logic 130B, the first and second inhibit voltage generators 151 and 152, and the voltage detector 180. As described above, the memory device 100g may further include the voltage detector 180, when comparing with the memory device 100f of FIG. 18. Therefore, differences of the memory device 100g according to the present embodiment from the memory device 100f of FIG. 18 will be described below.

The voltage detector 180 detects the node voltage VN2 of the connection node CN2 between the selected bit line BL3 and the write circuit 121B, and may provide the control logic 130B with the detected node voltage VN2. In one embodiment, the voltage detector 180 may detect the node voltage VN2 of the connection node CN2 in every programming loop. In another embodiment, the voltage detector 180 may detect the node voltage VN2 of the connection node CN2 in some of the plurality of programming loops.

The control logic 130B may generate the second inhibit control signal CTRL_inhx so that the voltage level of the second inhibit voltage Vinhx may be increased by the programming loop unit, based on the node voltage VN2 of the connection node CN2. In particular, the control logic 130B may determine the second inhibit voltage Vinhx to have the voltage level that is equal to or greater than the node voltage VN2.

In one embodiment, the control logic 130B may determine the second inhibit voltage Vinhx so that the voltage difference between the unselected word lines WL1, WL3, and WL4 and the selected bit line BL3 may be equal to or less than the threshold voltage of the selection device D included in each of the third unselected memory cells UMC3.

Also, the control logic 130B may further generate the first inhibit control signal CTRL_inhy so that the voltage level of the first inhibit voltage Vinhy may be increased according to the number of times of executing the programming loops, based on the node voltage VN2 of the connection node CN2. In particular, the control logic 130B may determine the first inhibit voltage Vinhy to have the voltage level that is equal to or greater than the second inhibit voltage Vinhx.

In one embodiment, the control logic 130B may determine the first inhibit voltage Vinhy so that the voltage difference between the unselected bit lines BL1, BL2, and BL4 and the unselected word lines WL1, WL3, and WL4 may be equal to or less than the threshold voltage of the selection device D included in each of the second unselected memory cells UMC2. In addition, the control logic 130B may determine the first inhibit voltage Vinhy so that the voltage difference between the unselected bit lines BL1, BL2, and BL4 and the selected word line WL2 may be equal to or less than the threshold voltage of the selection device D included in each of the first unselected memory cells UMC1.

Figure 20A:
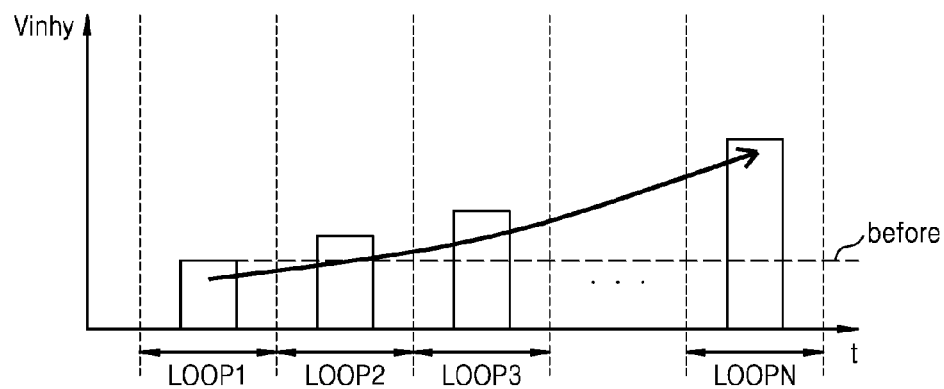
FIG. 20A is a graph showing an example of a first inhibit voltage in the memory device of FIG. 18 and the memory device of FIG. 19.

FIG. 20A is a graph showing an example of the first inhibit voltage Vinhy in the memory device 100f of FIG. 18 and in the memory device 100g of FIG. 19.

Referring to FIG. 20A, a horizontal axis denotes time and a vertical axis denotes the first inhibit voltage Vinhy. Traditionally, the first inhibit voltage Vinhy is constantly maintained regardless of time, that is, regardless of the increase in the number of times of executing the programming loops. However, according to the present embodiment, when the number of times of executing the programming loops increases, the voltage level of the first inhibit voltage Vinhy is gradually increased. That is, the first inhibit voltage Vinhy is changed adaptively with the change in the node voltage VN2 of the connection node CN2. In addition, according to another embodiment, the voltage level of the first inhibit voltage Vinhy may be slowly increased according to the increase in the number of times of executing the programming loops.

Figure 20B:
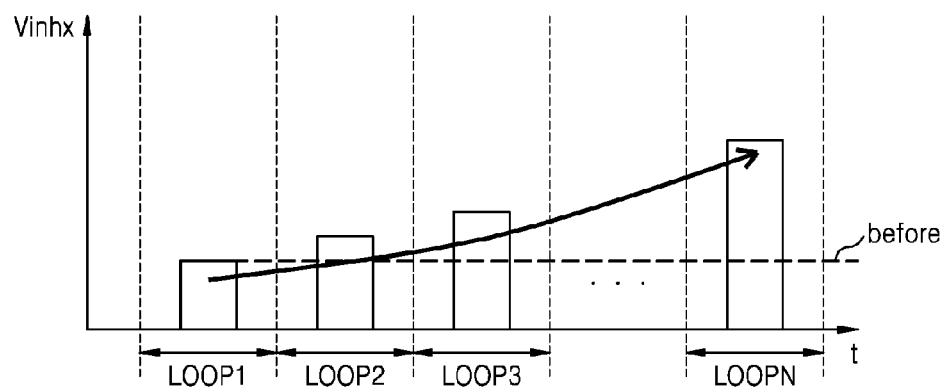
FIG. 20B is a graph showing an example of a second inhibit voltage in the memory device of claim 18 and the memory device of FIG. 19.

FIG. 20B is a graph showing an example of the second inhibit voltage Vinhx in the memory device 100f of FIG. 18 and in the memory device 100g of FIG. 19.

Referring to FIG. 20B, a horizontal axis denotes time and a vertical axis denotes the second inhibit voltage Vinhx. Traditionally, the second inhibit voltage Vinhx is constantly maintained regardless of time, that is, regardless of the increase in the number of times of executing the programming loops. However, according to the present embodiment, when the number of times of executing the programming loops increases, the voltage level of the second inhibit voltage Vinhx is gradually increased. That is, the second inhibit voltage Vinhx is changed adaptively with the change in the node voltage VN2 of the connection node CN2. In addition, according to another embodiment, the voltage level of the second inhibit voltage Vinhx may be slowly increased according to the increase in the number of times of executing the programming loops.

Figure 21:
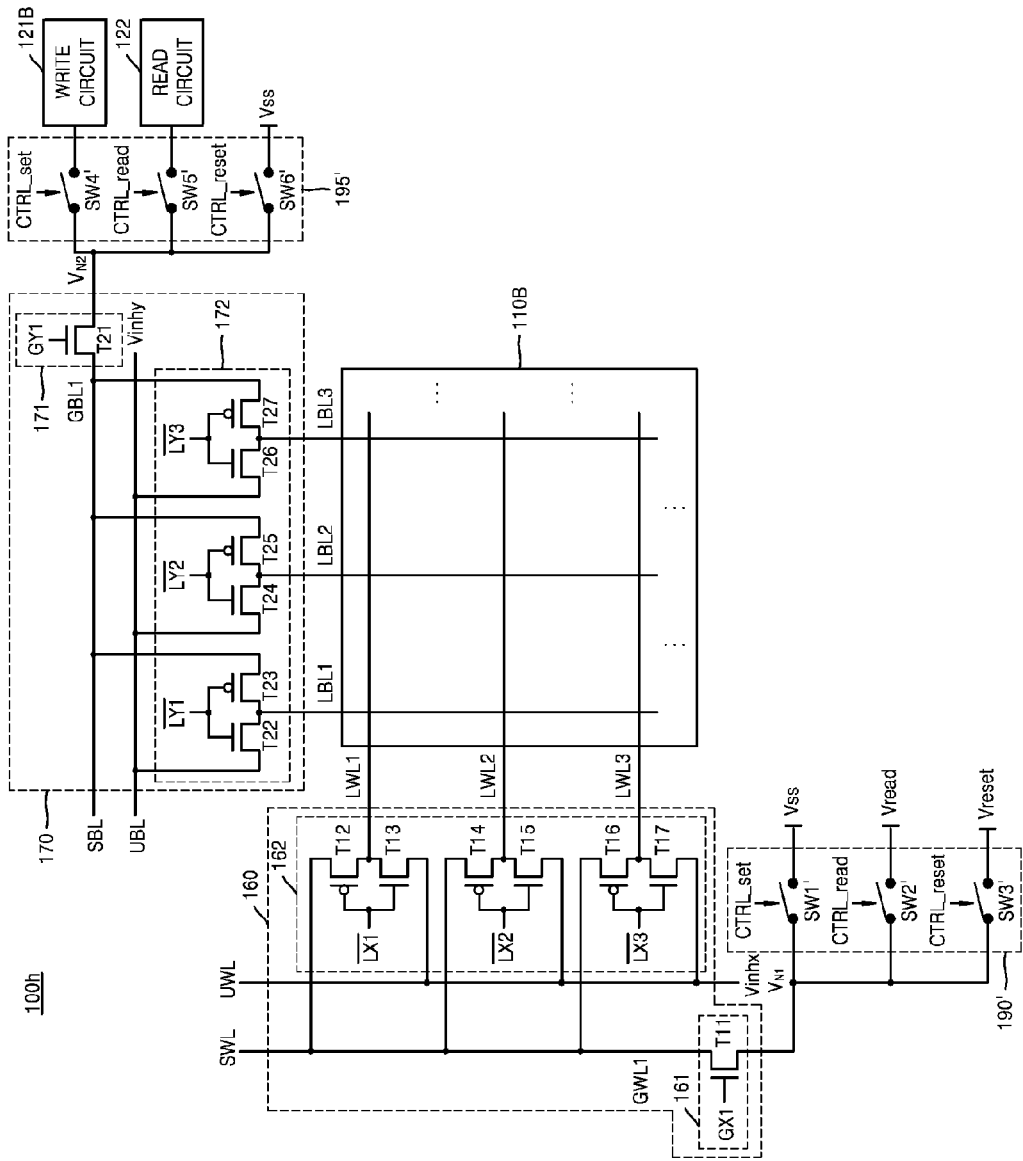
FIG. 21 is a circuit diagram of an example of the memory device including the memory cell array and the write circuit of FIG. 16.

FIG. 21 is a circuit diagram of an example of a memory device (100h) including the memory cell array 110B and the write circuit 121B of FIG. 16.

Referring to FIG. 21, the memory device 100h may include the memory cell array 110B, the write circuit 121B, the read circuit 122, the row decoder 160, the column decoder 170, and first and second switching units 190' and 195'. The memory device 100h of the present embodiment is a modified example of the memory device 100 of FIG. 2, and thus, descriptions with reference to FIG. 2 may be applied to the present embodiment. Also, although not shown in FIG. 21, the components included in the memory device 100 of FIG. 2 may be included in the memory device 100h of the present embodiment.

The row decoder 160 may include the first row decoder 161 and the second row decoder 162. The first row decoder 161 may activate the first global word line GWL1 in response to the first global row address GX1. The first row decoder 161 may include the transistor T11, and may be referred to as a global row switch. For example, if the first global row address GX1 is '1', the first row decoder 161 may connect the first global word line GWL1 to the first switching unit 190'.

The second row decoder 162 may activate first through third local word lines LWL1, LWL2, and LWL3 in response to first through third local row addresses LX1, LX2, and LX3. The first through third local word lines LWL1, LWL2, and LWL3 may correspond to the word lines WL1, WL2, and WL3 of FIG. 2. The second row decoder 162 may include transistors T12 through T17, and may be referred to as a local row switch. For example, if the first local row address LX1 is '1', the transistor TR12 is turned on and the transistor TR13 is turned off. As such, the first local word line LWL1 becomes the selected word line SWL, and then is connected to the first switching unit 190'. In addition, if the first local row address LX1 is '0', the transistor TR12 is turned off and the transistor TR13 is turned on. As such, the first local word line LWL1 is the unselected word line UWL, and then, may receive the second inhibit voltage Vinhx.

The first switching unit 190' may include first through third switches SW1', SW2', and SW3'. The first switch SW1' is turned on and turned off according to a set selection signal CTRL_set so that the ground voltage Vss may be applied to the first global word line GWL1. The second switch SW2' is turned on and turned off according to a read selection signal CTRL_read so that the read voltage Vread is applied to the first global word line GWL1. The third switch SW3' is turned on and turned off according to a reset selection signal CTRL_reset so that the reset voltage Vreset is applied to the first global word line GWL1. Here, the set selection signal CTRL_set, the read selection signal CTRL_read, and the reset selection signal CTRL_reset may be provided by the control logic 130.

The column decoder 170 may include the first column decoder 171 and the second column decoder 172. The first column decoder 171 may activate a first global bit line GBL1 in response to a first global column address GY1. The first column decoder 171 may include a transistor T21, and may be referred to as a global column switch. For example, if the first global column address GY1 is '1', the first column decoder 171 may connect the first global bit line GBL1 to the second switching unit 195'.

The second column decoder 172 may activate first through third local bit lines LBL1, LBL2, and LBL3 in response to first through third local column addresses LY1, LY2, and LY3. The first through third local bit lines LBL1, LBL2, and LBL3 may correspond to the bit lines BL1, BL2, and BL3 of FIG. 2. The second column decoder 172 may include transistors T22 through T27, and may be referred to as a local column switch. For example, if the first local column address LY1 is '1', the transistor T23 is turned on and the transistor T22 is turned off. As such, the first local bit line LBL1 is the selected bit line SBL, and is connected to the second switching unit 195'. In addition, if the local column address LY1 is '0', the transistor T23 is turned off and the transistor T22 is turned on. As such, the first local bit line LBL1 is the unselected bit line UBL that receives the first inhibit voltage Vinhy.

The second switching unit 195' may include fourth to sixth switches SW4', SW5', and SW6'. The fourth switch SW4' is turned on/off according to the set selection signal CTRL_set to connect the write circuit 121B to the first global bit line GBL1. The fifth switch SW5' is turned on/off according to the read selection signal CTRL_read to connect the read circuit 122 to the first global bit line GBL1. The sixth switch SW6' is turned on/off according to the reset selection signal CTRL_reset, so that the ground voltage Vss may be applied to the first global bit line GBL1. Here, the set selection signal CTRL_set, the read selection signal CTRL_read, and the reset selection signal CTRL_reset may be provided from the control logic 130.

Figure 22:
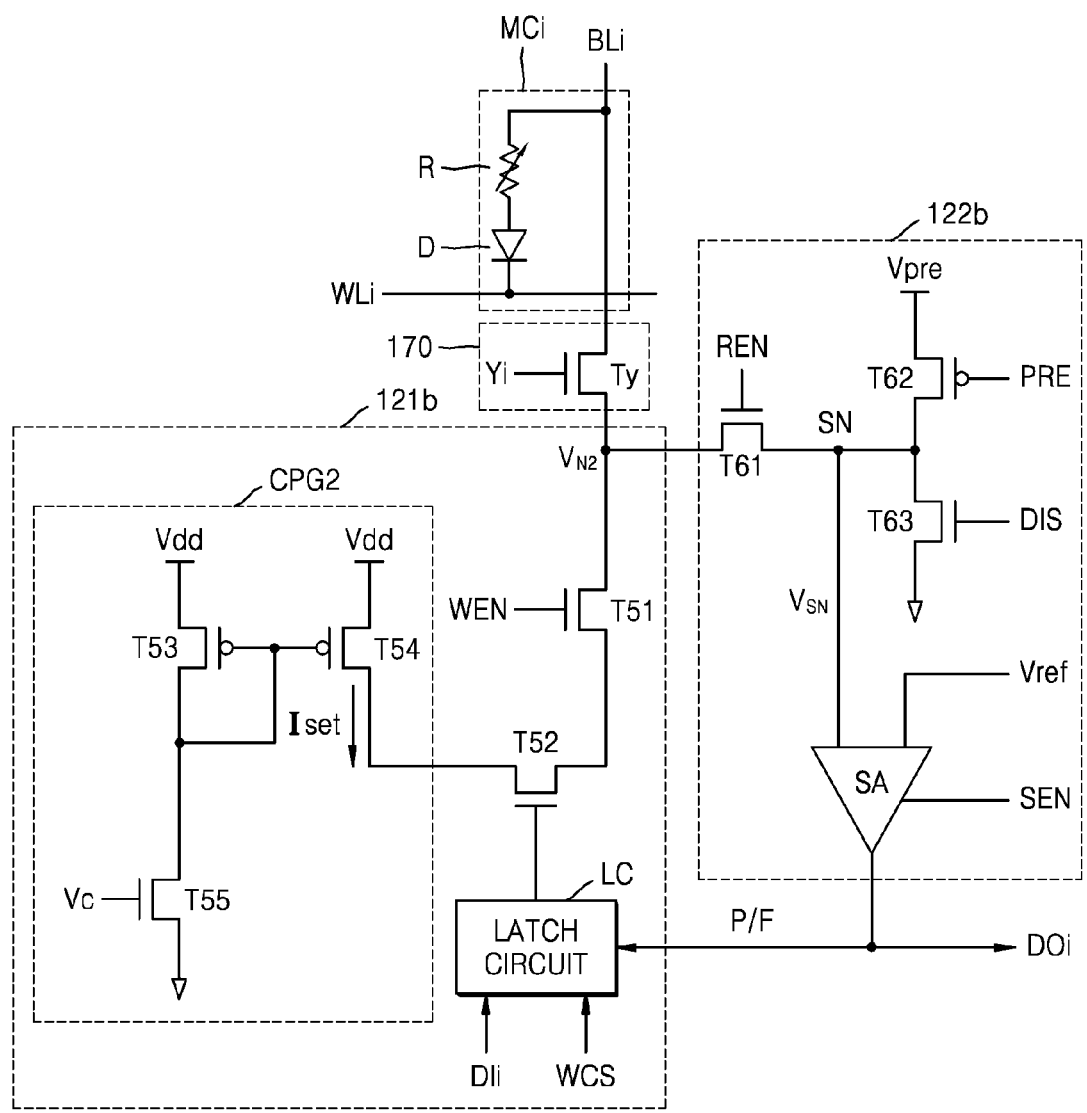
FIG. 22 is a detailed circuit diagram of an example of the write circuit of FIG. 16.

FIG. 22 is a circuit diagram of an example 121b of the write circuit of FIG. 16 in detail.

Referring to FIG. 22, a memory cell MCi is arranged on a region where a bit line BLi and a word line WLi cross each other, and may include a variable resistor device R and a selection device D. The column decoder 170 may include a bit line selection transistor Ty, and the bit line selection transistor Ty may connect the memory cell MCi to the write circuit 121b or a read circuit 122b in response to a column address Yi. Hereinafter, a case where the column address Yi is activated so that the memory cell MCi is connected to the write circuit 121b or the read circuit 122b will be described below.

The write circuit 121b may include first and second transistors T51 and T52, a current pulse provider CPG2, and a latch circuit LC. In the present embodiment, when a write enable signal WEN is activated, the first transistor T51 is turned on, and accordingly, the write circuit 121b may be connected to the memory cell MCi.

The current pulse provider CPG2 may include third to fifth transistors T53, T54, and T55. The third and fourth transistors T53 and T54 form a current mirror, and the fifth transistor T55 may provide the current pulse, that is, the set current Iset, in response to a control voltage Vc applied to a gate of the fifth transistor T55. As such, the write circuit 121b may provide the memory cell MCi with the set current Iset.

In the present embodiment, the control logic 130 may generate the voltage control signal CTRL_vol so that the control voltage Vc may increase according to the increase in the number of performing the programming loops. Accordingly, the current pulse provider CPG2 may provide the set current Iset that increases according to the increase in the number of programming loops.

The latch circuit LC may output a gate voltage in response to a write control signal WCS, so that the second transistor T52 may be selectively turned on according to a logic level of an input bit DIi. In one embodiment, if the write control signal WCS indicates the writing operation in the set direction, the latch circuit LC may turn on the second transistor T52 when the logic level of the input bit DIi is '0' and may turn off the second transistor T52 when the logic level of the input data DIi is '1'. In another embodiment, if the write control signal WCS indicates the writing operation in the reset direction, the latch circuit LC may turn off the second transistor T52 when the logic level of the input data DIi is '0', and may turn on the second transistor T52 when the logic level of the input data DIi is '1'.

The read circuit 122b may include first to third transistors T61, T62, and T63, and a sense amplifier SA. In the present embodiment, when a read enable signal REN is activated, the first transistor T61 is turned on, and accordingly, the read circuit 122b may be connected to the memory cell MCi.

When a precharge signal PRE is deactivated, the second transistor T62 is turned on and the bit line BLi may be pre-charged by the pre-charge voltage Vpre. In addition, when a discharge signal DIS is activated, the third transistor T63 is turned on and the bit line BLi may be initialized by the ground voltage.

The sense amplifier SA is activated according to the sense enable signal SEN to compare a voltage VSN of a sensing node SN with a reference voltage Vref and provide an output bit DOi representing whether the memory cell MCi is in a turned-on state or turned-off state. In a general reading operation, the output bit DOi may be provided to outside of the memory device 100, for example, to the memory controller 200.

In addition, in a verification reading operation for determining whether the writing operation is finished, the output bit DOi may be provided to inside of the memory device 100, for example, the latch circuit LC and the control logic 130, as a pass/fail (P/F) signal representing success/failure of the writing operation. If the pass/fail signal P/F denotes that the writing operation is finished, the latch circuit LC turns off the second transistor T52 regardless of the input bit DIi to terminate the writing operation on the memory cell MCi.

Although not shown in FIG. 22, the write circuit 121b may further include a voltage pulse generator. The voltage pulse generator may receive the control voltage Vc provided from the normal voltage generator 140, and may generate a voltage pulse corresponding to the control voltage Vc to provide the memory cell MCi with the voltage pulse.

Figure 23:
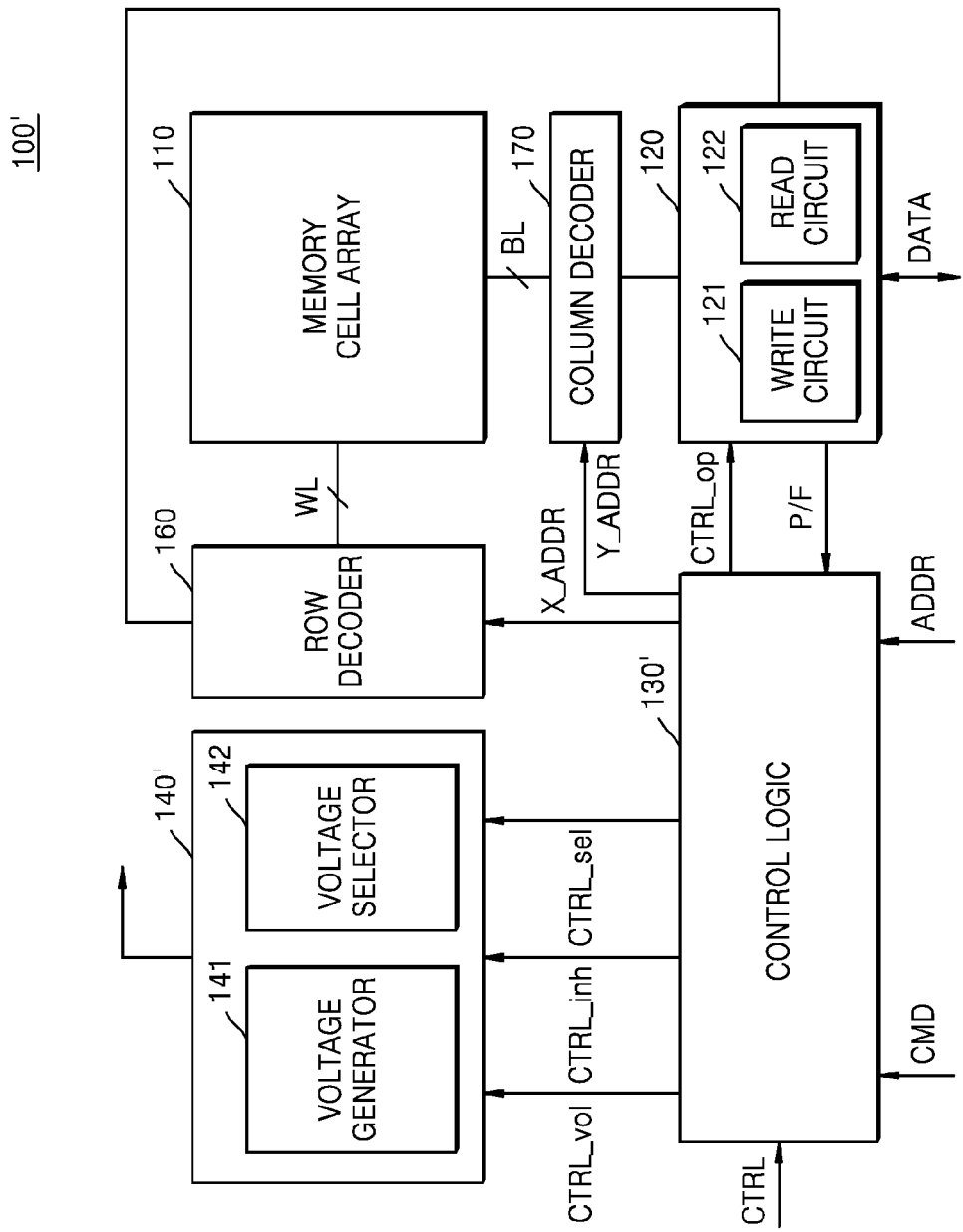
FIG. 23 is a block diagram of another example of the memory device included in the memory system of FIG. 1.

FIG. 23 is a block diagram of a memory device 100' included in the memory system 10 of FIG. 1, according to another exemplary embodiment of the application.

Referring to FIG. 23, the memory device 100' includes the memory cell array 110, the write/read circuit 120, a control logic 130', a voltage provider 140', the row decoder 160, and the column decoder 170. The write/read circuit 120 may include the write circuit 121 and the read circuit 122, and the voltage provider 140' may include a voltage generator 141 and a voltage selector 142. The memory device 100' of the present embodiment is a modified example of the memory device 100 of FIG. 2, and thus, descriptions with reference to FIG. 2 may be applied to the present embodiment. Hereinafter, differences of the memory device 100' according to the present embodiment from the memory device 100 of FIG. 2 will be described below.

The control logic 130' may output various control signals for writing data DATA on the memory cell array 110 or reading the data DATA from the memory cell array 110, based on a command CMD, an address ADDR, and a control signal CTRL transmitted from the memory controller 200. The various control signals output from the control logic 130' may be provided to the write/read circuit 120, the voltage provider 140', the row decoder 160, and the column decoder 170, and thus, the control logic 130' may control overall operations in the memory device 100'.

The control logic 130' may generate a voltage control signal CTRL_vol, an inhibit control signal CTRL_inh, and a voltage selection control signal CTRL_sel, based on the command CMD, the control signal CTRL, and a pass/fail signal P/F transmitted from the read circuit 122. The control logic 130' may provide the voltage provider 140' with the generated voltage control signal CTRL_vol, the inhibit control signal CTRL_inh, and the voltage selection control signal CTRL_sel.

The voltage generator 140 may generate various kinds of voltages for performing writing, reading, and erasing operations with respect to the memory cell array 110, based on the voltage control signal CTRL_vol. Here, the voltage control signal CTRL_vol is a signal for adjusting levels of the voltages provided by the voltage generator 141.

In particular, the voltage generator 141 may generate a reset write voltage Vreset, a set write voltage Vset, and a read voltage Vread applied to a selected memory cell MC_sel. Also, the voltage generator 141 may generate a power voltage Vdd and a precharge voltage Vpre applied to the write/read circuit 120. Also, the voltage generator 141 may generate a control voltage Vc that is necessary for the write circuit 121 to generate pulses.

Also, the voltage generator 141 may generate the first inhibit voltage Vinhy applied to the unselected bit lines UBL and the second inhibit voltage Vinhx applied to the unselected word lines UWL, based on the inhibit control signal CTRL_vol. Here, the inhibit control signal CTRL_vol is a signal for adjusting levels of the inhibit voltages provided by the voltage generator 141. In the present embodiment, at least one of the first and second inhibit voltages Vihnx and Vihny may be changed adaptively with the change in the node voltage VN of the connection node CN between the selected word line SWL or the selected bit line SBL and the write/read circuit 120.

The voltage selector 142 may select voltages that will be applied to the write/read circuit 120, the row decoder 160, and the column decoder 170 from among the voltages provided by the voltage generator 141, based on the voltage selection control signal CTRL_sel, and may output the selected voltages.

Figure 24:
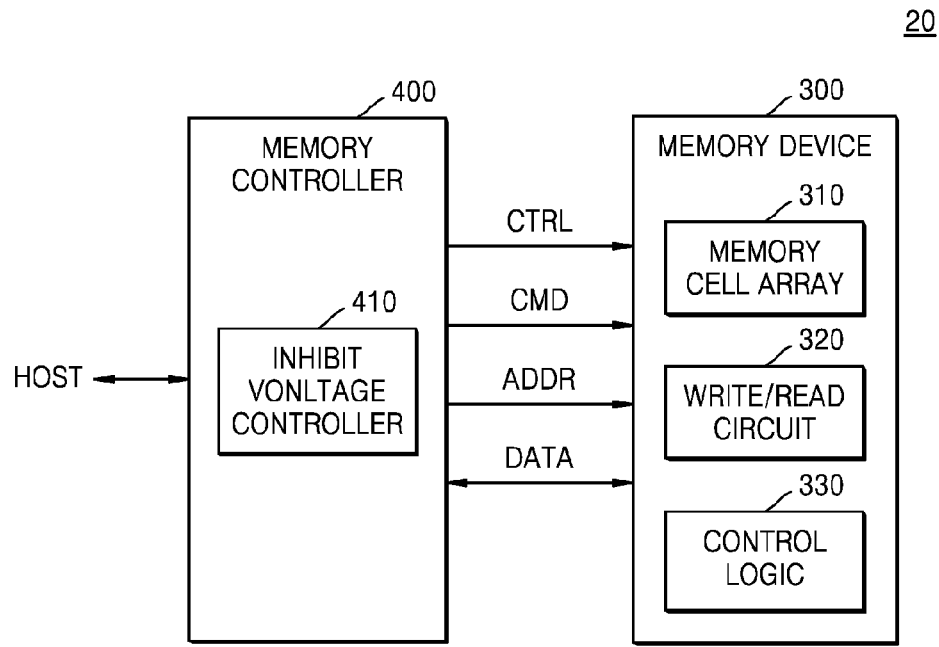
FIG. 24 is a schematic block diagram of a memory system according to another embodiment of the application.

FIG. 24 is a schematic block diagram of a memory system 20 according to another embodiment of the application.

Referring to FIG. 24, the memory system 20 may include a memory device 300 and a memory controller 400. The memory device 300 may include a memory cell array 310, a write/read circuit 320, and a control logic 330. The memory controller 400 may include an inhibit voltage controller 410.

The inhibit voltage controller 410 may determine at least one of the first and second inhibit voltages so that at least one of the first and second inhibit voltages respectively applied to unselected first and second signal lines connected to unselected memory cells may be changed according to the number of times of executing programming loops. In particular, the inhibit voltage controller 410 may determine at least one of the first and second inhibit voltages adaptively with the change in the node voltage VN of the connection node CN between a selected first or second signal line and the write/read circuit 320.

The inhibit voltage controller 410 may provide the memory device 300 with information about the determined at least one of the first and second inhibit voltages as a control signal CTRL. The control logic 330 may control the memory device 300 to generate the first and second inhibit voltages based on the control signal CTRL.

In one embodiment, if the node voltage VN of the connection node CN between the selected first or second signal line and the write/read circuit 320 is reduced according to the number of times of executing the programming loops, the inhibit voltage controller 410 may determine that at least one of the first and second inhibit voltages may be reduced according to the number of times of executing the programming loops. In another embodiment, if the node voltage VN of the connection node CN between the selected first or second signal line and the write/read circuit 320 is increased according to the number of times of executing the programming loops, the inhibit voltage controller 410 may determine that at least one of the first and second inhibit voltages may be increased according to the number of times of executing the programming loops.

As described above, according to the present embodiment, at least one of the first and second inhibit voltages is changed according to the number of times of executing the programming loops. Accordingly, a voltage difference between the selected first or second signal line and the unselected first or second signal line may not be increased even with the change in the node voltage VN of the connection node CN between the selected first or second signal line and the write/read circuit 320. Accordingly, the leakage current that may occur in the unselected memory cells may be reduced.

Figure 25:
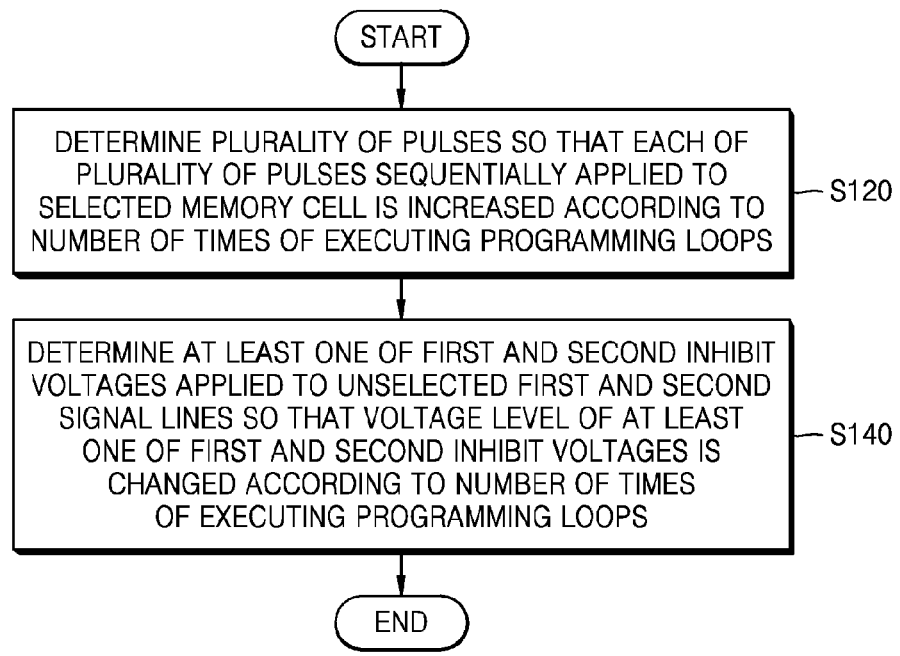
FIG. 25 is a flowchart of a method of operating a memory device, according to an embodiment of the application.

FIG. 25 is a flowchart illustrating a method of operating a memory device, according to an embodiment of the application.

Referring to FIG. 25, the method of operating the memory device according to the present embodiment is a method of performing an operation for determining voltages applied to the plurality of memory cells in order to perform a write operation on the memory cells included in a memory cell array of the memory device. The descriptions provided above with reference to FIGS. 1 through 24 may be applied to the method of operating the memory device according to the present embodiment. Hereinafter, the method of operating the memory device will be described below with reference to FIGS. 1 through 25.

In operation S120, a plurality of pulses are determined so that each of the plurality of pulses that are sequentially applied to the selected memory cell may be increased according to the number of times of executing the programming loops. In particular, the plurality of pulses may be determined so that at least one of amplitudes and pulse widths of the plurality of pulses may be increased when the number of times of executing the programming loops increases. However, one or more embodiments of the application are not limited thereto, that is, the plurality of pulses may be determined so that each of the plurality of pulses applied sequentially to the selected memory cell may be reduced according to the number of times of executing the programming loops.

In one embodiment, the plurality of pulses may correspond to a plurality of current pulses, and in operation S120, the plurality of current pulses may be determined so that at least one of the amplitudes and the pulse widths of the plurality of current pulses may be increased according to the number of times of executing the programming loops. Also, the method of the present embodiment may further include a process of performing a set writing operation, in which the plurality of current pulses are sequentially applied to the selected memory cell so as to reduce a resistance level of the selected memory cell.

In another embodiment, the plurality of pulses may correspond to a plurality of voltage pulses, and in operation S120, the plurality of voltage pulses may be determined so that at least one of the amplitudes and the pulse widths of the plurality of voltage pulses may be increased according to the number of times of executing the programming loops. Also, the method of the present embodiment may further include a process of performing a reset writing operation, in which the plurality of voltage pulses are applied to the selected memory cell so as to increase the resistance level of the selected memory cell.

In operation S140, in response to the increase of the plurality of pulses, at least one of the first and second inhibit voltages is determined so that a voltage level of the at least one of the first and second inhibit voltages applied respectively to the unselected first and second signal lines may be changed according to the number of times of executing the programming loops. In particular, the plurality of pulses may be provided sequentially from the write circuit, and the write circuit may be connected to the first signal line that is connected to the selected memory cell. At least one of the first and second inhibit voltages may be adaptively determined according to the change in the node voltage of the connection node between the write circuit and the selected first signal line according to the increase in each pulse.

In one embodiment, if the voltage of the selected first signal line is reduced according to the increase in each pulse, the second inhibit voltage may be determined so that the second inhibit voltage may be reduced according to the number of times of executing the programming loops. Moreover, according to the reduction in the second inhibit voltage, the first inhibit voltage may be determined so as to be reduced according to the number of times of executing the programming loops.

In another embodiment, when the voltage of the selected first signal line is increased according to the increase in each pulse, the second inhibit voltage may be determined so as to be increased according to the number of times of executing the programming loops. Moreover, according to the increase in the second inhibit voltage, the first inhibit voltage may be determined so as to be increased according to the number of times of executing the programming loops.

Figure 26:
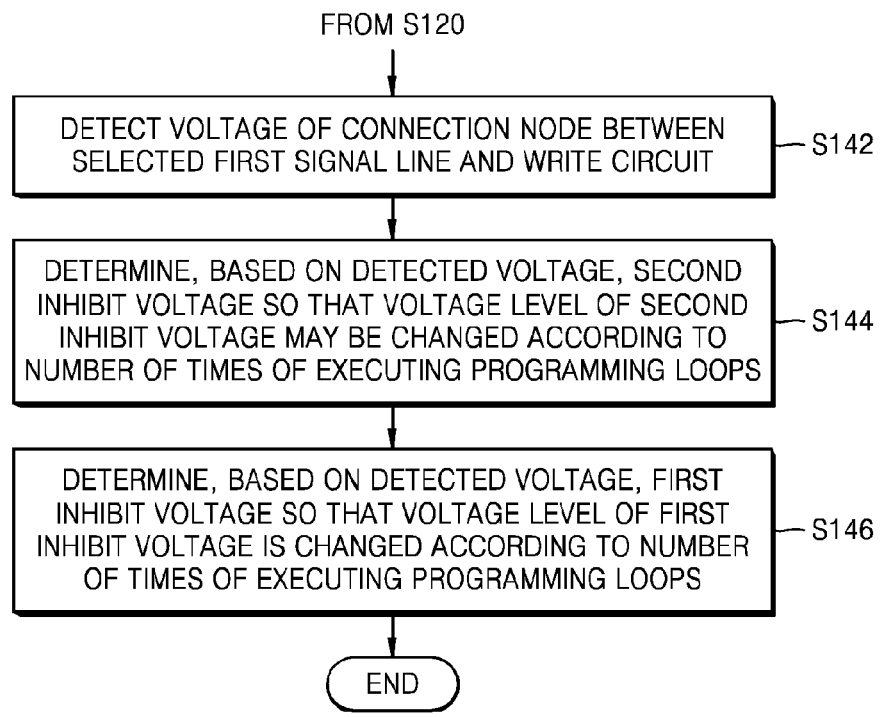
FIG. 26 is a detailed flowchart of an example of operation S140 shown in FIG. 25.

FIG. 26 is a flowchart illustrating operation S140 of FIG. 25 in more detail.

Referring to FIG. 26, in operation S142, the node voltage of the connection node between the selected first signal line and the write circuit is detected. In one embodiment, the node voltage may be detected in every programming loop. In another embodiment, the node voltage may be detected in only some of the plurality of programming loops.

In operation S144, the second inhibit voltage is determined so that the voltage level of the second inhibit voltage may be changed according to the number of times of executing the programming loops, based on the detected node voltage. In one embodiment, the second inhibit voltage may be determined to have the voltage level that is equal to or less than the detected node voltage.

In operation S146, the first inhibit voltage is determined so that the voltage level of the first inhibit voltage may be changed according to the number of times of executing the programming loops, based on the detected node voltage. In one embodiment, the first inhibit voltage may be determined to have the voltage level that is equal to or less than the second inhibit voltage.

However, one or more embodiments of the application are not limited thereto, that is, it may be determined so that the first and second inhibit voltages may be changed according to the number of times of executing the programming loops, without regard to the actual node voltage of the connection node.

Figure 27:
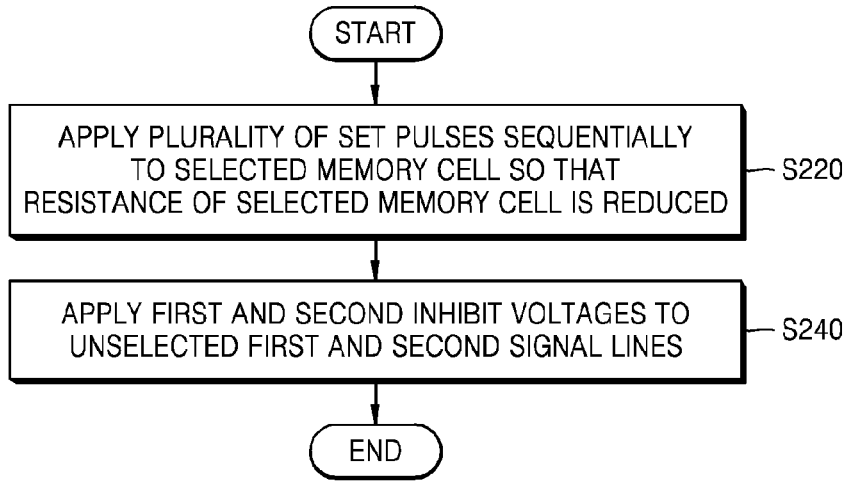
FIG. 27 is a flowchart of a method of operating a memory device, according to another embodiment of the application.

FIG. 27 is a flowchart illustrating a method of operating the memory device, according to another embodiment of the application.

Referring to FIG. 27, the method of operating the memory device is a method of performing the set writing operation on selected memory cells from among the plurality of memory cells. The descriptions provided above with reference to FIGS. 1 through 25 may be applied to the method of operating the memory device according to the present embodiment. Hereinafter, the method of operating the memory device according to the present embodiment will be described below with reference to FIGS. 1 through 26.

In operation S220, a plurality of set pulses are sequentially applied to a selected memory cell so that a resistance of the selected memory cell may be reduced. Here, the plurality of set pulses are sequentially provided from the write circuit that is connected to the selected first signal line connected to the selected memory cell.

In one embodiment, the set pulse may correspond to the current pulse, and at least one of amplitudes and pulse widths of the plurality of current pulses may be increased according to the number of times of executing the programming pulses. In another embodiment, the set pulse may correspond to a voltage pulse and at least one of amplitudes and pulse widths of the plurality of voltage pulses may be increased according to the number of times of executing the programming loops.

In operation S240, first and second inhibit voltages are applied to the unselected first and second signal lines, respectively. Here, a voltage level of at least one of the first and second inhibit voltages is changed according to the number of times of executing the programming loops.

In one embodiment, when the voltage of the selected first signal line is reduced according to the increase in the plurality of set pulses, the voltage level of the second inhibit voltage may be reduced according to the number of times of executing the programming loops. In another embodiment, when the voltage of the selected first signal line is increased according to the increase in the plurality of set pulses, the voltage level of the second inhibit voltage may be increased according to the number of times of executing the programming loops.

Figure 28:
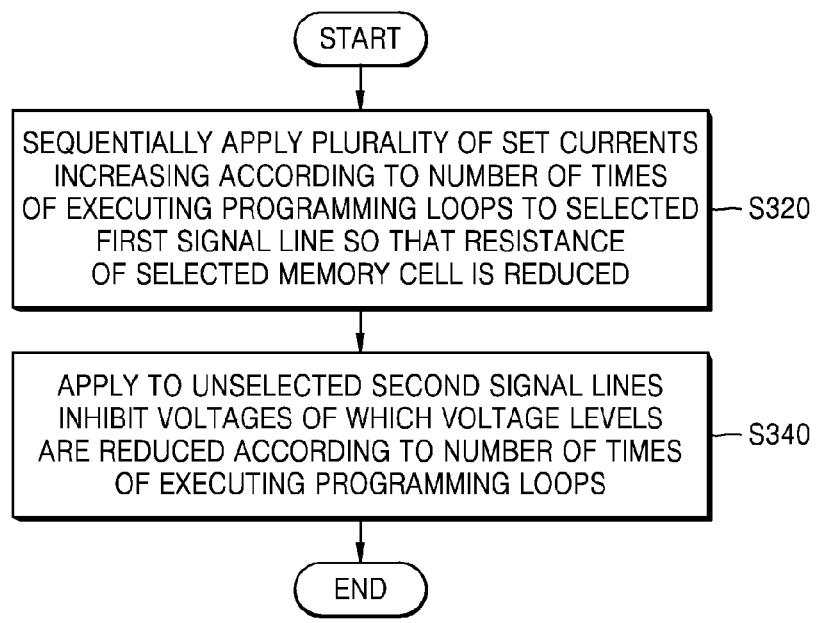
FIG. 28 is a flowchart of a method of operating a memory device, according to another embodiment of the application.

FIG. 28 is a flowchart illustrating a method of operating a memory device, according to another embodiment of the application.

Referring to FIG. 28, the method of operating the memory device according to the present embodiment is a method of performing a set writing operation on selected memory cells from among a plurality of memory cells, and the descriptions provided above with reference to FIGS. 1 through 27 may be applied to the method of operating the memory device according to the present embodiment. Hereinafter, the method of operating the memory device according to the present embodiment will be described below with reference to FIGS. 1 through 28.

In operation S320, a plurality of set currents, increasing according to number of times of executing programming loops, are sequentially applied to a selected first signal line so that a resistance of a selected memory cell may be reduced. Here, the plurality of set currents are sequentially provided from the write circuit that is connected to the selected first signal line connected to the selected memory cell.

In operation S340, an inhibit voltage, a voltage level of which is reduced according to the number of times of executing the programming loops, is applied to unselected second signal lines. Here, the voltage level of the inhibit voltage is reduced based on the node voltage of the connection node between the selected first signal line and the write circuit. In one embodiment, the voltage level of the inhibit voltage may be equal to or less than the node voltage of the connection node between the selected first signal line and the write circuit.

Figure 29:
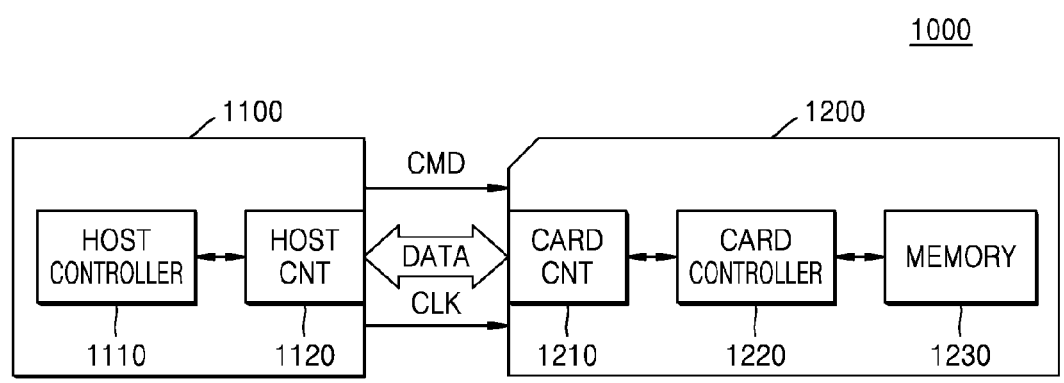
FIG. 29 is a block diagram of a memory card system including a memory system, according to the embodiment of the application.

FIG. 29 is a block diagram of a memory card system 1000 having a memory system applied thereto, according to an exemplary embodiment of the application.

Referring to FIG. 29, the memory card system 1000 may include a host 1100 and a memory card 1200. The host 1100 may include a host controller 1110 and a host connector 1120. The memory card 1200 may include a card connector 1210, a card controller 1220, and a memory device 1230. Here, the memory card 1200 may be embodied by using the exemplary embodiments shown in FIGS. 1 through 28.

The host 1100 may write data to the memory 1200 or may read data stored in the memory card 1200. The host controller 1110 may transmit a command CMD, a clock signal CLK generated by a clock generator (not shown) in the host 1100, and data DATA to the memory card 1200 via the host connector 1120.

In response to the command CMD received via the card connector 1210, the card controller 1220 may store the data DATA in the memory device 1230, in synchronization with a clock signal that is generated by a clock generator (not shown) in the card controller 1220. The memory device 1230 may store the data DATA that is transmitted from the host 1100.

The memory card 1200 may be embodied as a compact flash card (CFC), a microdrive, a smart media card (SMC), a multimedia card (MMC), a Security Digital Card (SDC), a memory stick, or a USB flash memory drive.

Figure 30:
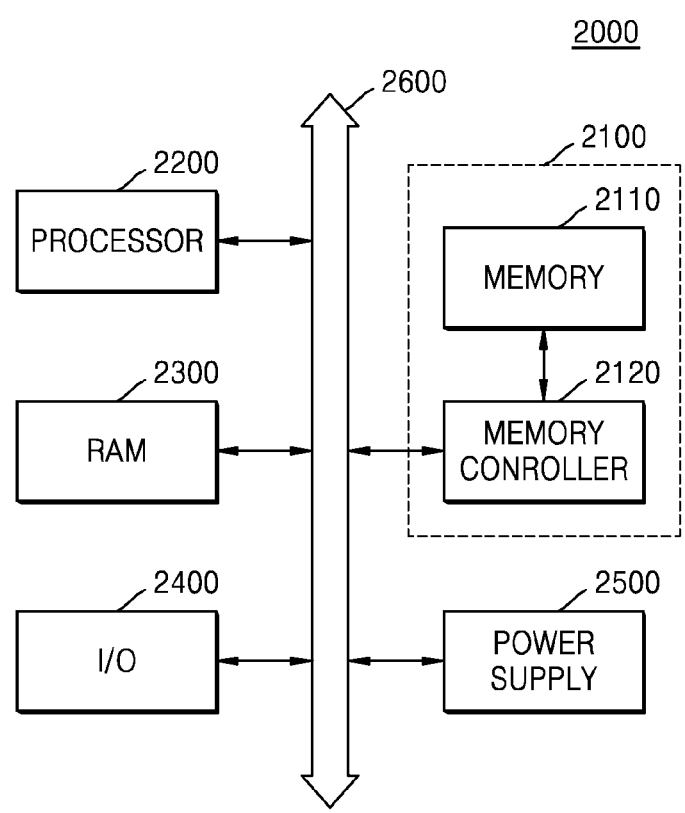
FIG. 30 is a block diagram of a computing system including a memory system according to the embodiment of the application.

FIG. 30 is a block diagram of a computing system 2000 including a memory system according to an exemplary embodiment of the application.

Referring to FIG. 30, the computing system 2000 may include a memory system 2100, a processor 2200, a RAM 2300, an input/output (I/O) device 2400, and a power supply device 2500. Although not illustrated in FIG. 30, the computing system 2000 may further include ports capable of communicating with a video card, a sound card, a memory card, or a USB device, or other electronic devices. The computing system 2000 may be embodied as a PC, or a portable electronic device such as a notebook computer, a mobile phone, a personal digital assistant (PDA), or a camera.

The processor 2200 may perform particular calculations or tasks. In one or more exemplary embodiments, the processor 2200 may be a micro-processor or a Central Processing Unit (CPU). The processor 2200 may perform communication with the RAM 2300, the I/O device 2400, and the memory system 2100 via a bus 2600 such as an address bus, a control bus, or a data bus. Here, the memory system 2100 may be embodied by using the exemplary embodiments shown in FIGS. 1 through 29. The memory system 2100 may include a memory 2110 and a memory controller 2120.

In one or more exemplary embodiments, the processor 2200 may also be connected to an extended bus such as a Peripheral Component Interconnect (PCI) bus.

The RAM 2300 may store data for operations of the computing system 2000. As described above, the memory device according to the one or more exemplary embodiments of the application may be applied to the RAM 2300. Alternatively, a DRAM, a mobile DRAM, an SRAM, a PRAM, an FRAM, or an MRAM may be used as the RAM 2300.

The I/O device 2400 may include an input unit such as a keyboard, a keypad, or a mouse, and an output unit such as a printer or a display. The power supply device 2500 may supply an operating voltage for the operations of the computing system 2000.

Figure 31:
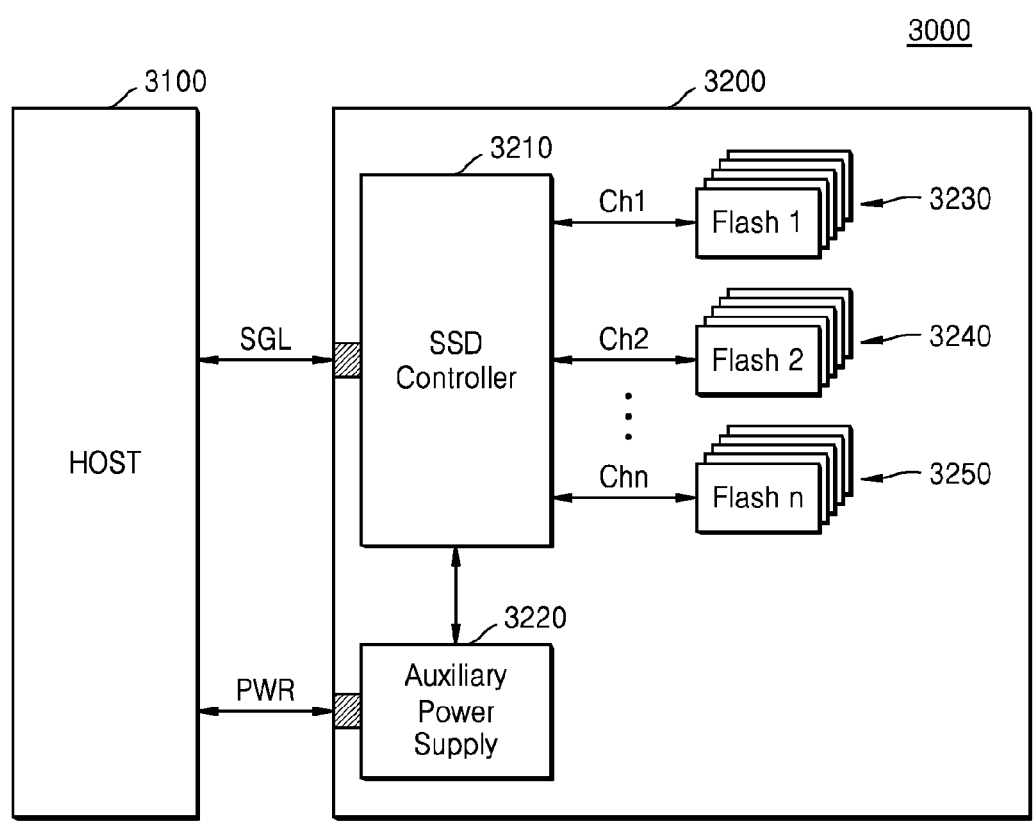
FIG. 31 is a block diagram of an SSD system including a memory system, according to the embodiment of the application.

FIG. 31 is a block diagram of a solid state disk (SSD) system 3000 including a memory system applied thereto, according to an exemplary embodiment of the application.

Referring to FIG. 31, the SSD system 3000 may include a host 3100 and an SSD 3200. The SSD 3200 exchanges signals SGL with the host 3100 via a signal connector, and may receive a power input PWR from a power connector. The SSD 3200 includes an SSD controller 3210, an auxiliary power device 3220, and a plurality of memory devices 3230, 3240, and 3250. The SSD controller communicates with memory devices 3230 through 3250 via communication channels Ch1 through Chn. Here, the SSD 3200 may be embodied by using the exemplary embodiments of FIGS. 1 through 30.

While the application has been particularly shown and described with reference to exemplary embodiments thereof, it will be understood that various changes in form and details may be made therein without departing from the spirit and scope of the following claims.

What is claimed is:

1. A method of operating a memory device comprising a plurality of memory cells that are respectively arranged in regions where a plurality of first signal lines and a plurality of second lines cross each other, the method comprising:
determining a plurality of pulses so that each of the plurality of pulses that are sequentially applied to a selected memory cell among the plurality of memory cells may be changed according to a number of times of executing programming loops; and determining, in response to the change of the plurality of pulses, at least one of a first inhibit voltage and a second inhibit voltage, so that a voltage level of at least one of the first and second inhibit voltages, that are respectively applied to unselected first and second signal lines connected to unselected memory cells among the plurality of memory cells, is changed according to the number of times of executing the programming loops.

2. The method of claim 1, wherein the plurality of pulses are sequentially provided from a write circuit that is connected to the selected first signal line connected to the selected memory cell, and at least one of an amplitude and a pulse width of each of the plurality of pulses is changed according to the number of times of executing the programming loops, and the determining of the at least one of the first and second inhibit voltages comprises determining at least one of the first and second inhibit voltages according to a change in a node voltage of a connection node between the selected first signal line and the write circuit according to an increase in the plurality of pulses.

3. The method of claim 2, wherein the determining of at least one of the first and second inhibit voltages comprises determining the second inhibit voltage so that a voltage level of the second inhibit voltage is reduced according to the number of times of executing the second inhibit voltage if the node voltage is reduced according to the increase in the plurality of pulses.

4. The method of claim 3, wherein the determining of at least one of the first and second inhibit voltages comprises determining the first inhibit voltage so that a voltage level of the first inhibit voltage is reduced according to the number of times of executing the programming loops and according to the reduction in the voltage level of the second inhibit voltage.

5. The method of claim 2, wherein the determining of at least one of the first and second inhibit voltages comprises determining the second inhibit voltage so that a voltage level of the second inhibit voltage is increased according to the number of times of executing the programming loops if the node voltage increases according to the increase in the plurality of pulses.

6. The method of claim 5, wherein the determining of at least one of the first and second inhibit voltages comprises determining the first inhibit voltage so that a voltage level of the first inhibit voltage is increased according to the number of times of executing the programming loops and according to the increase in the voltage level of the second inhibit voltage.

7. The method of claim 2, wherein the determining of at least one of the first and second inhibit voltages comprises determining the second inhibit voltage so that a voltage level of the second inhibit voltage is changed according to the number of times of executing the programming loops, and the method further comprises applying the determined second inhibit voltage to the unselected second signal lines.

8. The method of claim 2, wherein the determining of at least one of the first and second inhibit voltages further comprises:

detecting the node voltage; and determining, based on the detected node voltage, the second inhibit voltage so that the voltage level of the second inhibit voltage is changed according to the number of times of executing the programming loops, wherein the method further comprises applying the determined second inhibit voltage to the unselected second signal lines.

9. The method of claim 2, wherein the determining of at least one of the first and second inhibit voltages comprises determining the second inhibit voltage to have a voltage level that is equal to or less than the node voltage.

10. The method of claim 1, wherein the plurality of pulses correspond to a plurality of current pulses, and the determining of the plurality of pulses comprises determining the plurality of current pulses so that at least one of amplitudes and pulse widths of the plurality of current pulses is increased according to the number of times of executing the programming loops.

11. The method of claim 10, further comprising performing a set writing operation in which the plurality of current pulses are sequentially applied to the selected memory cell so that a resistance level of the selected memory cell is reduced.

12. The method of claim 1, wherein the plurality of pulses correspond to a plurality of voltage pulses, and the determining of the plurality of pulses comprises determining the plurality of voltage pulses so that at least one of amplitudes and pulse widths of the plurality of voltage pulses is increased according to the number of times of executing the programming pulses.

13. The method of claim 12, further comprising performing a reset writing operation in which the determined voltages are sequentially applied to the selected memory cell so that a resistance level of the selected memory is increased.

* * * * *